(12) United States Patent
Asuri et al.

(10) Patent No.: US 10,454,509 B2
(45) Date of Patent: Oct. 22, 2019

(54) COMMUNICATION CIRCUIT INCLUDING A TRANSMITTER

(71) Applicant: QUALCOMM Incorporated, San Diego, CA (US)

(72) Inventors: Bhushan Shanti Asuri, San Diego, CA (US); Krishnaswamy Thiagarajan, Bangalore (IN); Ashok Swaminathan, Cardiff, CA (US); Shahin Mehdizad Taleie, San Diego, CA (US); Yen-Wei Chang, Mountain View, CA (US); Vinod Panikkath, San Diego, CA (US); Sameer Vasantlal Vora, San Diego, CA (US); Ayush Mittal, Bangalore (IN); Tonmoy Biswas, Bangalore (IN); Sy-Chyuan Hwu, San Diego, CA (US); Zhilong Tang, Irvine, CA (US); Ibrahim Chamas, Carlsbad, CA (US); Ping Wing Lai, San Diego, CA (US); Behnam Sedighi, La Jolla, CA (US); Dongwon Seo, San Diego, CA (US); Nitz Saputra, San Bruno, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/962,865

(22) Filed: Apr. 25, 2018

(65) Prior Publication Data

US 2019/0288722 A1    Sep. 19, 2019

Related U.S. Application Data

(60) Provisional application No. 62/642,567, filed on Mar. 13, 2018.

(51) Int. Cl.
 *H04B 1/04* (2006.01)
 *H04L 27/20* (2006.01)
 *H04B 1/00* (2006.01)

(52) U.S. Cl.
 CPC ............. *H04B 1/04* (2013.01); *H04B 1/0028* (2013.01); *H04L 27/206* (2013.01)

(58) Field of Classification Search
 CPC ....... H04B 1/04; H04B 1/0475; H04B 1/0483
 See application file for complete search history.

(56) References Cited

U.S. PATENT DOCUMENTS 4,006,351 A    2/1977    Constant
4,532,639 A    7/1985    Price et al.
(Continued)

FOREIGN PATENT DOCUMENTS

CN    1211944 C    7/2005
CN    1663131 A    8/2005
(Continued)

OTHER PUBLICATIONS

Din I., et al., "Wideband SAW-Less Receiver Front-End with Harmonic Rejection Mixer in 65-nm CMOS", IEEE Transactions on Circuits and Systems-II: Express Briefs, vol. 60, No. 5, May 2013, pp. 242-246.
(Continued)

*Primary Examiner* — Blane J Jackson
(74) *Attorney, Agent, or Firm* — Qualcomm Incorporated/Seyfarth Shaw LLP; Alan M. Lenkin

(57) ABSTRACT

A communication circuit may include a first pair of digital-to-analog converters (DACs) coupled to an input of a first mixer and configured to generate first baseband signals. The communication circuit may further include a second pair of DACs coupled to an input of a second mixer and configured to generate second baseband signals. The second baseband
(Continued)

signals may be shifted in phase relative to the first baseband signals.

21 Claims, 13 Drawing Sheets

(56) References Cited

U.S. PATENT DOCUMENTS

| | | | |
|---|---|---|---|
| 4,742,532 A | 5/1988 | Walker | |
| 5,710,521 A | 1/1998 | Butler | |
| 5,841,388 A | 11/1998 | Yasuda et al. | |
| 5,898,665 A | 4/1999 | Sawahashi et al. | |
| 5,959,499 A | 9/1999 | Khan et al. | |
| 5,995,567 A | 11/1999 | Cioffi et al. | |
| 6,342,821 B1 | 1/2002 | Kim | |
| 6,400,233 B1 | 6/2002 | Thomas | |
| 6,625,436 B1 | 9/2003 | Tolson et al. | |
| 6,745,003 B1 | 6/2004 | Maca et al. | |
| 6,947,710 B2 | 9/2005 | Samuels et al. | |
| 7,062,233 B2 | 6/2006 | Huttunen | |
| 7,120,414 B2 | 10/2006 | Kim et al. | |
| 7,221,300 B2 | 5/2007 | Fontaine et al. | |
| 7,483,685 B2 | 1/2009 | Lewis | |
| 7,519,348 B2 | 4/2009 | Shah | |
| 7,657,241 B2 | 2/2010 | Shah | |
| 7,711,329 B2 | 5/2010 | Aparin et al. | |
| 7,761,063 B2 | 7/2010 | Tsuda et al. | |
| 7,965,134 B2 | 6/2011 | Aparin et al. | |
| 8,135,348 B2 | 3/2012 | Aparin | |
| 8,160,514 B2 | 4/2012 | Aparin et al. | |
| 8,498,605 B1 | 7/2013 | Cook et al. | |
| 8,583,072 B1 | 11/2013 | Ciubotaru et al. | |
| 8,606,210 B2 | 12/2013 | Ru et al. | |
| 8,704,582 B2 | 4/2014 | Goel et al. | |
| 8,774,314 B2 | 7/2014 | Aparin | |
| 9,008,161 B1 | 4/2015 | Chang et al. | |
| 9,935,663 B1 | 4/2018 | Rofougaran et al. | |
| 10,009,050 B2 * | 6/2018 | Chen | H04L 25/49 |
| 1,030,552 A1 | 5/2019 | Asuri et al. | |
| 2001/0038666 A1 | 11/2001 | Mesecher et al. | |
| 2002/0041208 A1 | 4/2002 | Hamada et al. | |
| 2002/0072344 A1 | 6/2002 | Souissi | |
| 2002/0080891 A1 | 6/2002 | Ahn et al. | |
| 2002/0136324 A1 | 9/2002 | Nagasaka | |
| 2003/0031271 A1 | 2/2003 | Bozeki et al. | |
| 2003/0125065 A1 | 7/2003 | Barak | |
| 2004/0109512 A1 | 6/2004 | Fonden et al. | |
| 2004/0142667 A1 | 7/2004 | Lochhead et al. | |
| 2004/0166813 A1 | 8/2004 | Mann et al. | |
| 2004/0237007 A1 | 11/2004 | Busking | |
| 2005/0047521 A1 | 3/2005 | Ishikawa et al. | |
| 2005/0073361 A1 | 4/2005 | Hamada et al. | |
| 2005/0124375 A1 | 6/2005 | Nowosielski | |
| 2005/0176388 A1 | 8/2005 | Yamawaki et al. | |
| 2005/0180527 A1 | 8/2005 | Suzuki et al. | |
| 2005/0197090 A1 | 9/2005 | Stockstad et al. | |
| 2005/0253745 A1 | 11/2005 | Song et al. | |
| 2006/0050810 A1 | 3/2006 | Haque et al. | |
| 2006/0105715 A1 | 5/2006 | Kodani et al. | |
| 2006/0205370 A1 | 9/2006 | Hayashi et al. | |
| 2006/0281419 A1 | 12/2006 | Peplinski et al. | |
| 2007/0069813 A1 | 3/2007 | Li et al. | |
| 2007/0184782 A1 | 8/2007 | Sahota et al. | |
| 2008/0057901 A1 | 3/2008 | Stoll et al. | |
| 2008/0130798 A1 | 6/2008 | Ohba et al. | |
| 2008/0171522 A1 | 7/2008 | Ben-Ayun et al. | |
| 2008/0194222 A1 | 8/2008 | Liu et al. | |
| 2008/0233894 A1 | 9/2008 | Aparin | |
| 2008/0242346 A1 | 10/2008 | Rofougaran | |
| 2008/0284487 A1 | 11/2008 | Pullela et al. | |
| 2009/0036082 A1 | 2/2009 | Sajid et al. | |
| 2009/0042521 A1 | 2/2009 | Otaka et al. | |
| 2009/0174459 A1 | 7/2009 | Cicalini | |
| 2009/0213770 A1 | 8/2009 | Mu | |
| 2009/0221245 A1 | 9/2009 | Gonikberg et al. | |
| 2009/0264089 A1 | 10/2009 | Suzuki et al. | |
| 2009/0268849 A1 | 10/2009 | Mu et al. | |
| 2009/0280767 A1 | 11/2009 | Tillman | |
| 2010/0048149 A1 | 2/2010 | Tang et al. | |
| 2010/0109771 A1 | 5/2010 | Baik et al. | |
| 2010/0120377 A1 | 5/2010 | He | |
| 2010/0167639 A1 | 7/2010 | Ranson et al. | |
| 2010/0201442 A1 | 8/2010 | Akaiwa | |
| 2010/0327932 A1 | 12/2010 | Aparin et al. | |
| 2011/0013677 A1 | 1/2011 | Ibrahim et al. | |
| 2011/0158346 A1 | 6/2011 | Ballantyne | |
| 2011/0193606 A1 | 8/2011 | Sun et al. | |
| 2011/0249770 A1 | 10/2011 | Bellaouar et al. | |
| 2012/0049926 A1 | 3/2012 | Shimizu et al. | |
| 2012/0105128 A1 | 5/2012 | Jeurissen et al. | |
| 2013/0059556 A1 | 3/2013 | Molnar et al. | |
| 2013/0115907 A1 | 5/2013 | Theodoratos et al. | |
| 2014/0349716 A1 | 11/2014 | Axholt et al. | |
| 2015/0180521 A1 | 6/2015 | Tripurari et al. | |
| 2015/0288412 A1 | 10/2015 | Aalto et al. | |
| 2017/0310456 A1 | 10/2017 | Tajalli et al. | |
| 2018/0091098 A1 | 3/2018 | Duncan et al. | |

FOREIGN PATENT DOCUMENTS

| | | |
|---|---|---|
| CN | 101267218 A | 9/2008 |
| EP | 1657814 A1 | 5/2006 |
| EP | 2019486 A1 | 1/2009 |
| JP | H0888577 A | 4/1996 |
| JP | 2000115009 A | 4/2000 |
| JP | 2000509577 A | 7/2000 |
| JP | 2001060903 A | 3/2001 |
| JP | 2006140785 A | 6/2006 |
| JP | 2007174252 A | 7/2007 |
| JP | 2008017218 A | 1/2008 |
| TW | 200737858 A | 10/2007 |
| WO | 9740587 A1 | 10/1997 |
| WO | 03065602 A2 | 8/2003 |
| WO | 03103166 A1 | 12/2003 |
| WO | 2005053152 A1 | 6/2005 |
| WO | 2006068635 A1 | 6/2006 |
| WO | 2007013177 A1 | 2/2007 |
| WO | 2007092767 A1 | 8/2007 |
| WO | 2008004916 A1 | 1/2008 |
| WO | 2008048534 A1 | 4/2008 |
| WO | 2008094259 A1 | 8/2008 |
| WO | 2008118898 A1 | 10/2008 |
| WO | 2008139390 A1 | 11/2008 |
| WO | 2010011977 A1 | 1/2010 |

OTHER PUBLICATIONS

International Preliminary Report on Patentability—PCT/US2010/062233—The International Bureau of WIPO—Geneva, Switzerland, dated Jul. 4, 2012 (082486WO).
International Search Report and Written Opinion—PCT/US2010/028738, International Search Authority—European Patent Office—dated Aug. 10, 2010 (090031).
International Search Report and Written Opinion—PCT/US2010/039612, International Search Authority—European Patent Office—dated Sep. 17, 2010 (082062).
International Search Report and Written Opinion—PCT/US2010/062233—ISA/EPO—dated Apr. 13, 2011 (082486WO).
International Search Report and Written Opinion—PCT/US2011/021213—ISA/EPO—dated May 26, 2011 (100510WO).
International Search Report and Written Opinion—PCT/US2010/040252, International Search Authority—European Patent Office—dated Oct. 5, 2010 (082381).
Keysight Technologies, "Demystifying the Impact of ADCs and DACs on Test Instrument Specifications—Application Note," 2015, pp. 1-22.
Mizusawa N., et al., "Third- and fifth-order baseband component injection for linearization of the power amplifier in a cellular phone", IEEE Transactions on Microwave Theory and Techniques, IEEE Service Center, Piscataway, NJ, US, vol. 53, No. 11, Nov. 1,

(56) References Cited

OTHER PUBLICATIONS 2005 (Nov. 1, 2005), pp. 3327-3334, XP001512580, ISSN: 0018-9480, DOI: DOI:10.1109/TMTT.2005.855747.

Razavi, "A 900-MHz/1.8-GHz CMOS transmitter for dual-band applications," IEEE Journal of Solid-State Circuits, May 1999, vol. 34, No. 5, pp, 573-579.

Razavi, "Architectures and circuits for RF CMOS receivers," IEEE 1998 Custom Integrated Circuits Conference, May 1998, pp. 393-400.

Rudell, et al., "A 1.9-GHz Wide-Band IF Double Conversion CMOS Receiver for Cordless Telephone Application" IEEE Journal of Solid-State Circuits, IEEE Service Center, Piscataway, NJ, US, vol. 32, No. 12, Dec. 1, 1997 (Dec. 1, 1997), pp. 2071-2088, XP011060631.

Taiwan Search Report—TW099109207—TIPO—dated Nov. 24, 2012 (090031TW).

Taiwan Search Report—TW099146399—TIPO—dated Aug. 5, 2013 (082486TW).

Tektronix, "High-Speed DACs—Application Note," 2014, pp. 1-18.

Yang C.K.K., et al., "A Serial-Link Transceiver Based on 8-GSamples/s A/D and D/A Converters in 0.25-μm CMOS", IEEE Journal of Solid-State Circuits, vol. 36, No. 11, Nov. 2001, pp. 1684-1692.

\* cited by examiner

COMMUNICATION CIRCUIT INCLUDING A TRANSMITTER

CROSS-REFERENCE TO RELATED APPLICATION

This application claims the benefit of U.S. Provisional Patent Application No. 62/642,567, filed on Mar. 13, 2018, entitled "COMMUNICATION CIRCUIT INCLUDING VOLTAGE MODE HARMONIC-REJECTION MIXER (HRM)," the disclosure of which is expressly incorporated by reference herein in its entirety.

BACKGROUND

Field

The present disclosure relates generally to radio frequency (RF) mixers and, more specifically, to a communication circuit including a transmitter.

Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station.

In RF applications, a local oscillator (LO) input signal is mixed with another input signal at a mixer to achieve frequency translation, which is generally called up-conversion or down-conversion. In an up-conversion configuration, an input baseband signal is up-converted to an RF signal. In a down-conversion configuration, the input RF signal is down-converted to a baseband signal. The baseband signal is a complex valued signal that includes an in-phase (I) and a quadrature-phase (Q) signal.

Conversion to or from a complex baseband signal uses two mixers. One mixer is driven by an in-phase LO signal and the other mixer is driven by a quadrature-phase LO signal. In the case of up-conversion, the other mixer ports of the two mixers are driven by the I and Q baseband signals, and an output of the two mixers is summed to create an RF signal.

Conventional transmitters use two digital-to-analog converters (DACs) for generating the I and Q baseband signals. Conventional transmitters also use resistive phase interpolators for processing the I and Q baseband signals. However, resistive phase interpolators are area-inefficient on a chip, and phase interpolation creates voltage loss.

It is therefore desirable to implement a transmitter that is area efficient and reduces voltage loss.

SUMMARY

A communication circuit may include a first pair of digital-to-analog converters (DACs) coupled to an input of a first mixer and configured to generate first baseband signals. The communication circuit may further include a second pair of DACs coupled to an input of a second mixer and configured to generate second baseband signals. The second baseband signals may be shifted in phase relative to the first baseband signals.

A method for communication may include generating first baseband signals with a first pair of digital-to-analog converters (DACs). The method may further include generating second baseband signals with a second pair of DACs. The second baseband signals may be shifted in phase relative to the first baseband signals.

A communication circuit may include first means for generating first baseband signals. The communication circuit may further include second means for generating second baseband signals. The second baseband signals may be shifted in phase relative to the first baseband signals.

Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
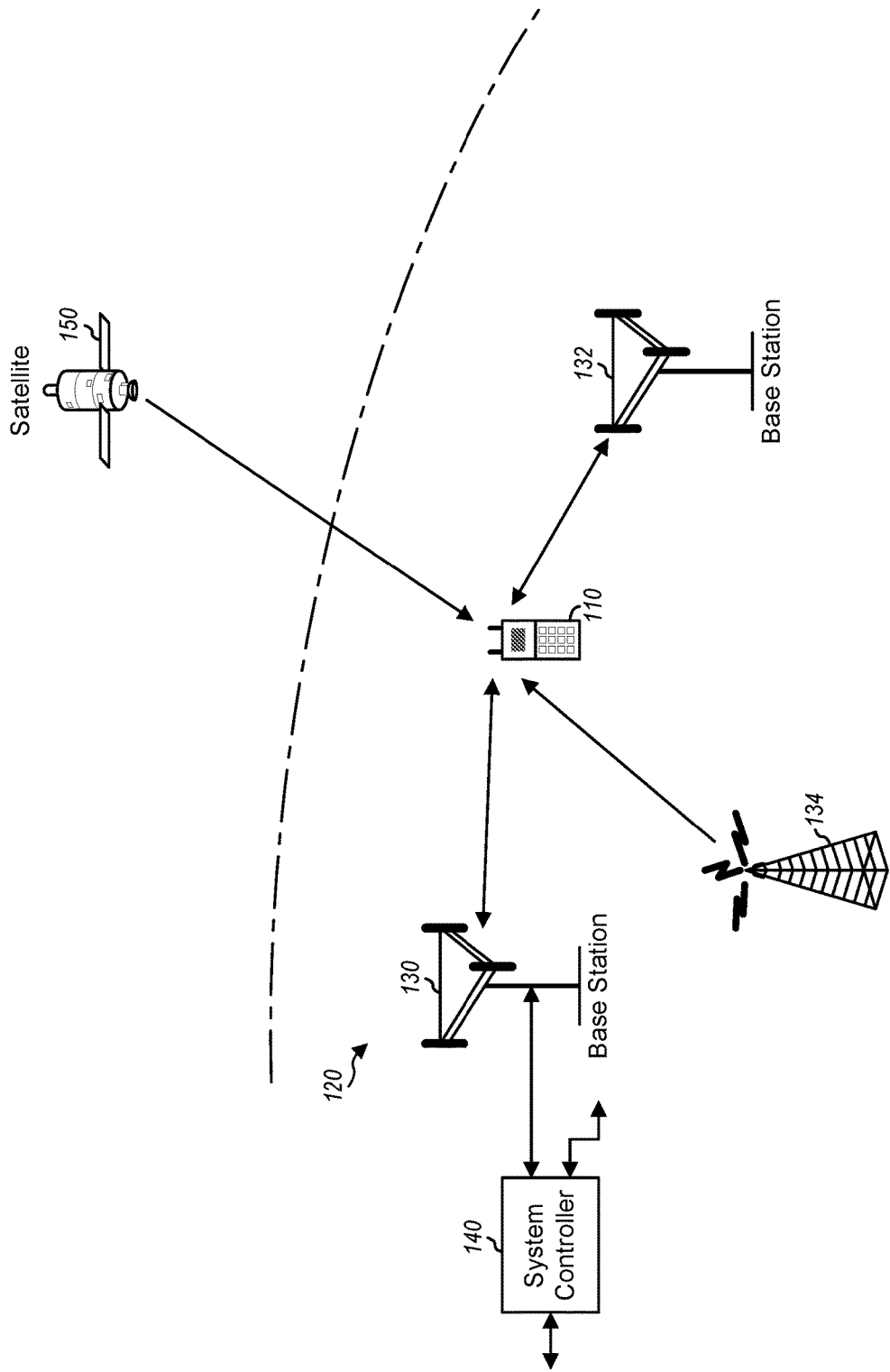
FIG. 1 shows a wireless device communicating with a wireless system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations. As described herein, the term "low impedance," used throughout this description means "low voltage swings, large current." As described herein, the term "high impedance," used throughout this description means "high voltage swings, small current."

Fabricating mobile radio frequency (RF) chips (e.g., mobile RF transceivers) becomes complex at deep submicron process nodes due to cost and power consumption considerations. Further design challenges for mobile RF transceivers include analog/RF performance considerations, including mismatch, noise and other performance considerations. The design complexity of these mobile RF transceivers is further complicated by added circuit functions to support communication enhancements.

A wireless device (e.g., a cellular phone or a smartphone) in a wireless communication system may include a mobile RF transceiver to transmit and receive data for two-way communication. The mobile RF transceiver may include a transmit section for data transmission and a receive section for data reception. For data transmission, the transmit section may modulate an RF carrier signal with data to obtain a modulated RF signal, amplify the modulated RF signal to obtain an amplified RF signal having the proper output power level, and transmit the amplified RF signal via an antenna to a base station. For data reception, the receive section may obtain a received RF signal via the antenna and may amplify and process the received RF signal to recover data sent by the base station.

The basic operation of the receiver in a mobile RF transceiver is as follows. For the receiver, a signal from the antenna may be amplified in an RF stage (e.g., low noise amplifier (LNA)). The output of the RF stage is provided to a first input of an RF mixer. A local oscillator (LO) signal is provided to a second input of the RF mixer. The RF mixer generates an intermediate frequency (IF) output signal. A second mixer stage may convert the IF output signal to a baseband signal. The baseband signal is then demodulated. The modulation technique is independent from the receiver technology.

The basic operation of a transmitter in a mobile RF transceiver is as follows. A local oscillator (LO) input signal is mixed with another input signal at a mixer to achieve frequency translation to up-convert a signal. For single stage up-conversion, an input baseband signal is up-converted into an RF signal. The baseband signal is a complex valued signal that includes an in-phase (I) and a quadrature-phase (Q) signal.

Conventional transmitters use two digital-to-analog converters (DACs) for generating the I and Q baseband signals. Conventional transmitters also use resistive phase interpolators for processing the I and Q baseband signals. However, resistive phase interpolators are area-inefficient on a chip, and phase interpolation creates voltage loss. It is therefore desirable to implement a transmitter that is area efficient and reduces voltage loss.

Aspects of the present disclosure include a transmitter having a first pair of digital-to-analog converters (DACs) coupled to an input of a first mixer. The first pair of DACs may be configured to generate first baseband signals. A second pair of DACs may be coupled to an input of a second mixer. The second pair of DACs may be configured to generate second baseband signals. The second baseband signals may be shifted in phase relative to the first baseband signals.

FIG. 1 shows a wireless device 110, including a harmonic-rejection mixer, communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five (5) carriers in one or two bands in LTE Release 11.

Figure 2:
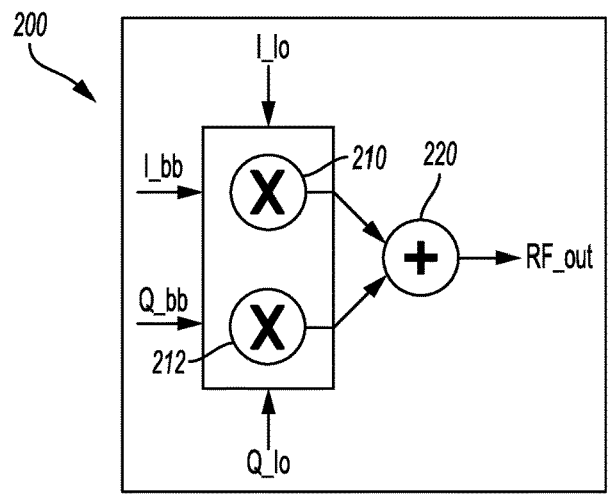
FIG. 2 is a block diagram of a conventional mixer.

FIG. 2 illustrates a block diagram of a conventional mixer 200. The mixer 200 combines a complex valued baseband (BB) signal with a complex valued local oscillator (LO) signal. For example, each of the baseband signal and the LO signal includes in-phase (I) signals (e.g., I_lo and I_bb) and quadrature-phase (Q) signals (e.g., Q_lo and Q_bb).

In the case of up-conversion, an input baseband signal is up-converted to a radio frequency (RF) signal. To accomplish this, two sub-mixers are used. A first sub-mixer 210 is driven by I_lo and I_bb, and a second sub-mixer 212 is driven by Q_lo and Q_bb. The output of the two mixers is summed by a summer 220 to generate the RF signal RF_out.

A disadvantage of the conventional mixer 200 is that it generates unwanted harmonic signals. The generated non-linearities occur because the mixer 200 operates as a linear but time-variant circuit. For example, the mixer 200 generates a desired signal that includes a local oscillator component and a baseband component (e.g., LO+BB), where the LO component is one frequency, and the baseband component is another frequency. Unfortunately, because the mixer 200 is effectively a switch that is switched on and off by a square wave, undesired harmonics including a third order compound signal (e.g., 3LO−BB) and fifth order compound signal (e.g., 5LO+BB) are also generated. Another problem of the conventional mixer 200 is that, in addition to being linear and time-variant, the mixer 200 also has inherent non-linearity because it is built from transistor based switches that are not ideal. As a result, the mixer 200, in generating the desired compound signal LO+BB, will also naturally generate undesired harmonic signals (e.g., LO+3BB, LO+5BB, LO−3BB, etc.)

Figure 3:
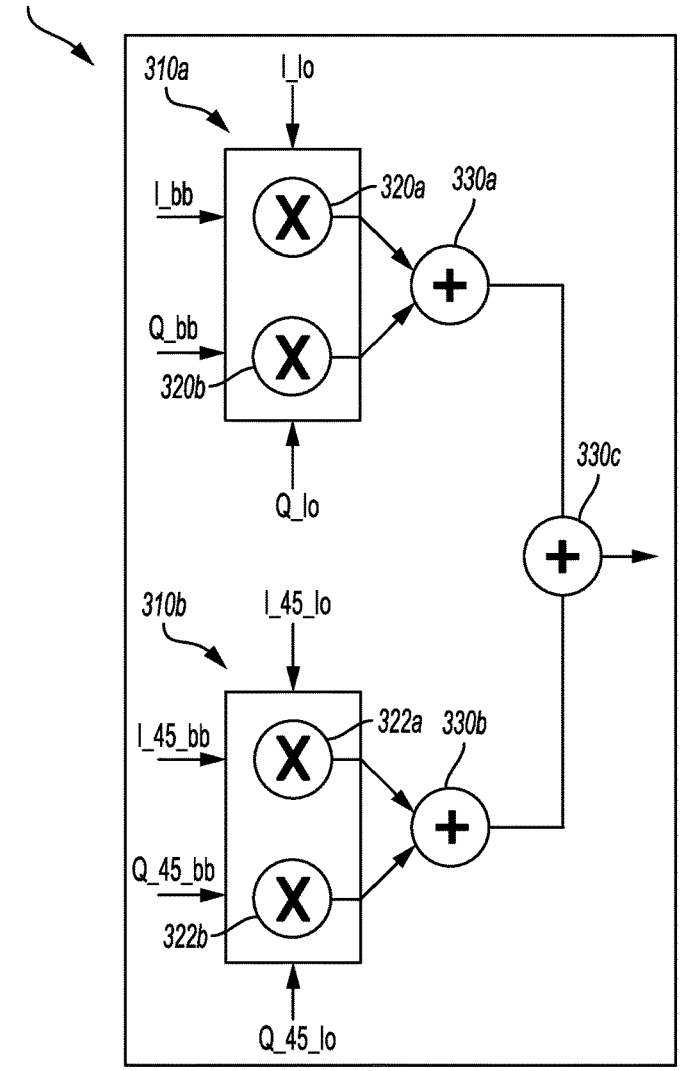
FIG. 3 is a block diagram of a conventional harmonic-rejection mixer (HRM).

FIG. 3 illustrates a block diagram of a conventional harmonic-rejection mixer (HRM) 300. Similar to the above-described conventional mixer 200, the harmonic reject mixer 300 includes a first mixer 310a having a first sub-mixer 320a and a second sub-mixer 320b. The first sub-mixer 320a is driven by input in-phase signals I_lo and I_bb, and the second sub-mixer 320b is driven by input quadrature signals Q_lo and Q_bb. A first summer 330a sums the output of the first mixer 310a.

Additionally, the harmonic reject mixer 300 includes a second mixer 310b. The second mixer 310b includes a third sub-mixer 322a and a fourth sub-mixer 322b. The third sub-mixer 322a is driven by input in-phase signals I_45_lo and I_45_bb, and the fourth sub-mixer 322b is driven by input quadrature signals Q_45_lo and Q_45_bb. Input in-phase signals I_45_lo, I_45_bb, Q_45_lo, and Q_45_bb are phase shifted by 45 degrees relative to input signals I_lo, I_bb, Q_lo, and Q_bb, respectively. For example, the phase shifted signals may be generated by summing the in-phase and quadrature components (e.g., I+Q) and dividing the sum by the square root of two (V).

The harmonic reject mixer 300 further includes a second summer 330b, which sums the output of the second mixer 310b. A third summer 330c sums the outputs of the first summer 330a and the second summer 330b.

The conventional harmonic reject mixer 300 provides improved operation over the conventional mixer 200 by canceling unwanted linear time-variant information of the mixer 200. For example, the outputs of the first mixer 310a and the second mixer 310b are summed to provide full cancellation of the LO harmonics and the baseband non-linearities. As such, the undesired harmonics, such as 3LO-BB and 5LO+BB, etc., are canceled out by the harmonic reject mixer 300. Additionally, by using multiple baseband phases, the harmonic reject mixer 300 also cancels out non-linear terms (e.g., LO−3BB and LO+5BB). Although the conventional harmonic reject mixer 300 is an improvement over the conventional mixer 200, current configurations of the conventional harmonic reject mixer 300 are area-inefficient and are unable to operate satisfactorily in voltage-mode.

Figure 4A:
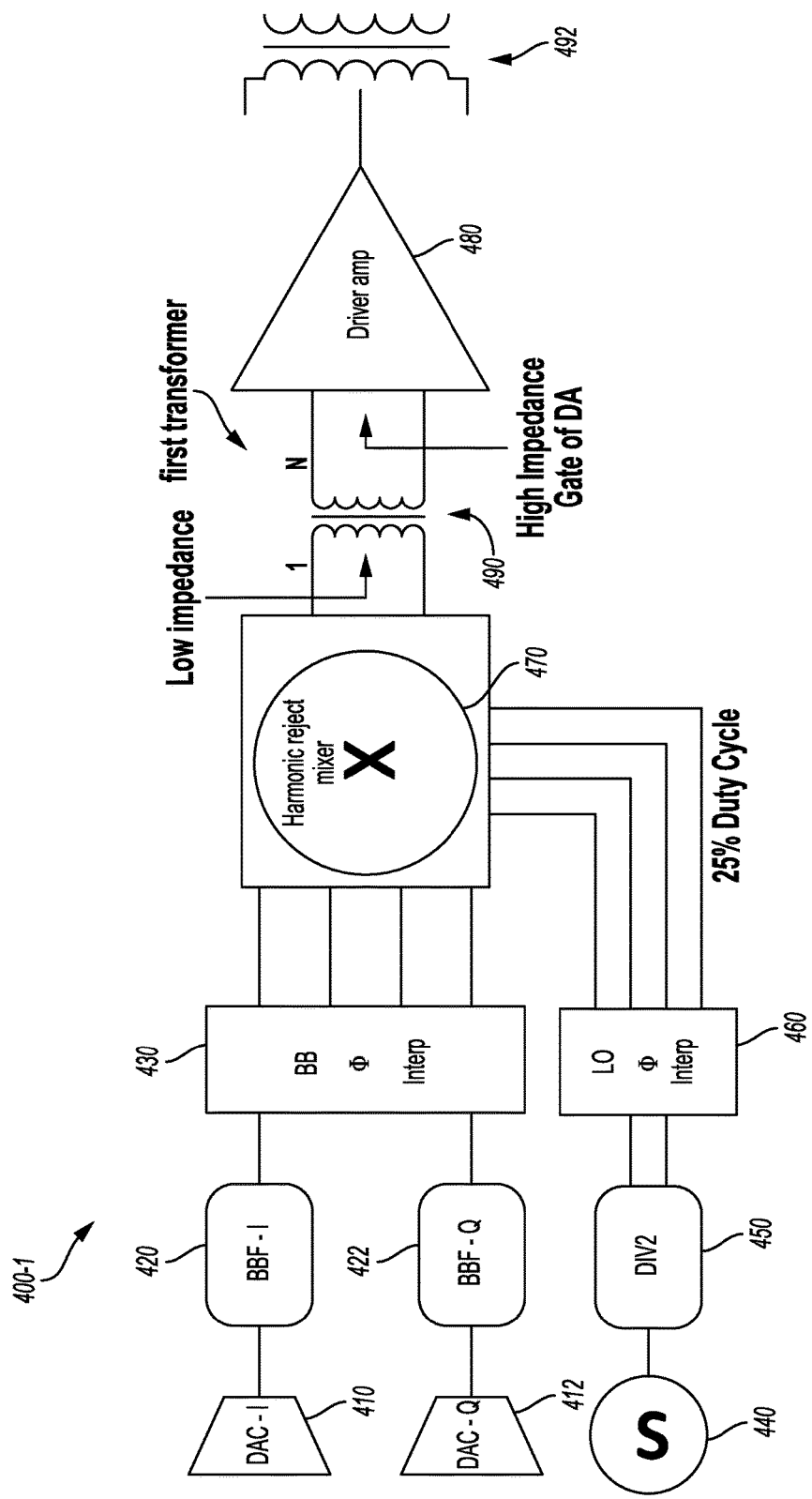
FIGS. 4A and 4B are block diagrams of conventional transmitters.

FIG. 4A illustrates a conventional transmitter 400-1 including a conventional harmonic-rejection mixer (HRM) 470 operating in current mode. The transmitter 400-1 includes a first digital-to-analog converter (DAC) 410 coupled to a first baseband filter (BBF) 420, and a second DAC 412 coupled to a second baseband filter 422. The first baseband filter 420 and the second baseband filter 422 are coupled to a baseband (BB) phase interpolator 430. The baseband phase interpolator 430 is coupled to the HRM 470.

The transmitter 400-1 further includes an oscillator 440 coupled to a divider 450. The divider 450 is coupled to a local oscillator (LO) phase interpolator 460. The LO phase interpolator 460 is coupled to the HRM 470 and produces signals having a 25% duty cycle. Additionally, the HRM 470 is coupled to a first transformer 490. The first transformer 490 is coupled to a driver amplifier (DA) 480, and the DA 480 is coupled to a second transformer 492.

The transmitter 400-1 operates according to a 25% duty cycle even though multiple phases are mixed that may overlap in time. This overlap is allowed if an output of the HRM 470 is terminated at a very low impedance. For example, the first transformer 490 converts a high impedance at an input of the DA 480 to a low impedance at the output of the HRM 470. When that happens, RF signals output from the HRM 470 act like a current, which can be summed together.

Unfortunately, a disadvantage of operating in current mode is that the first transformer 490 occupies a large area. This is especially undesirable for complementary metal oxide semiconductor (CMOS) technologies involved in implementing mixers because of limited space on a die. It is desirable to directly couple the HRM 470 to the DA 480 without impedance matching by the first transformer 490. Elimination of the first transformer 490 would result in improved area efficiency on a die. Additionally, the baseband phase interpolator 430 is implemented as a resistor bank (e.g., a resistor ladder), which is also area inefficient.

Figure 4B:
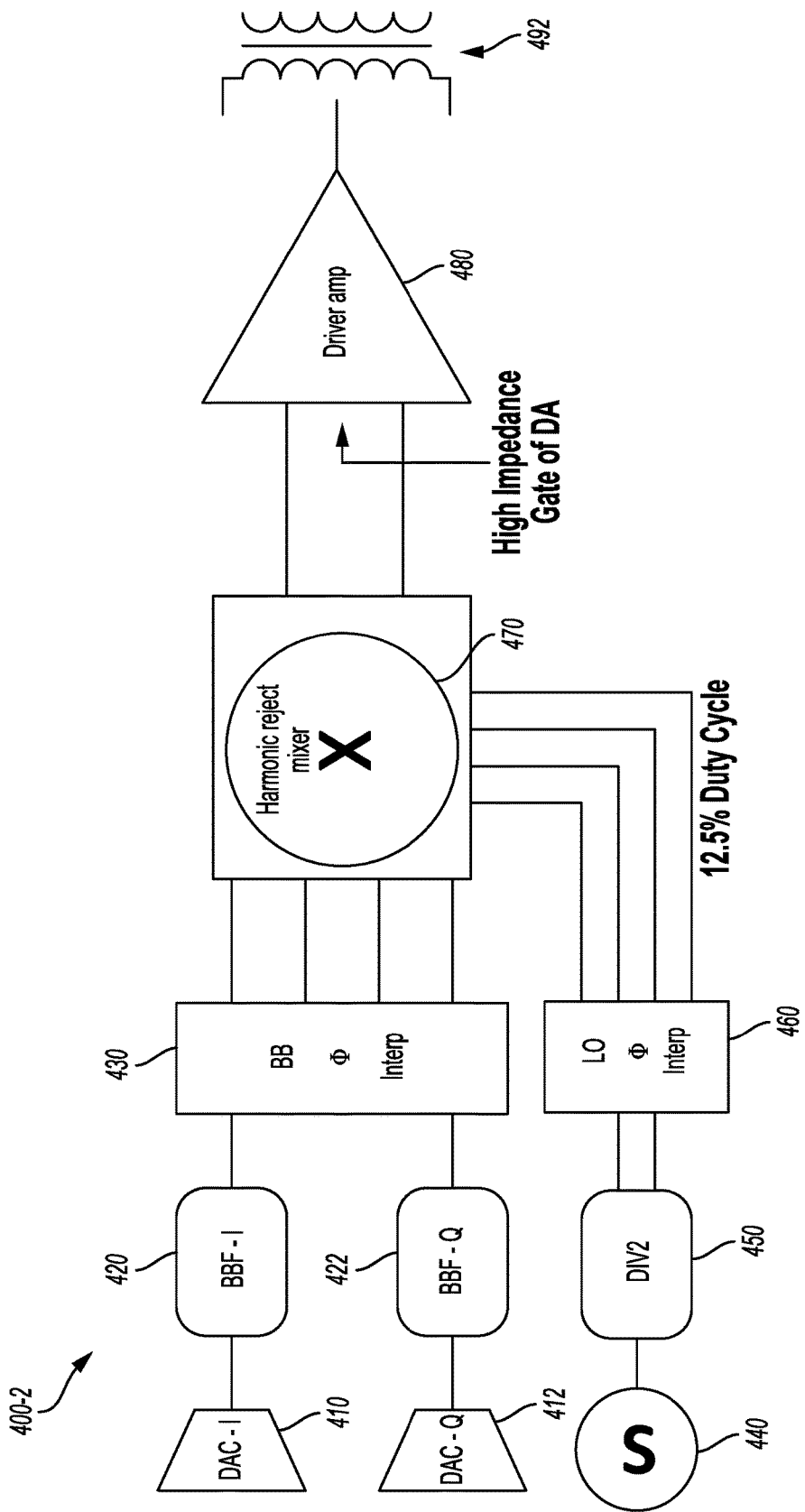

FIG. 4B illustrates a conventional transmitter 400-2 including a harmonic-rejection mixer (HRM) 470 operating in voltage mode. The transmitter 400-2 includes a first digital-to-analog converter (DAC) 410 coupled to a first baseband filter (BBF) 420, and a second DAC 412 coupled to a second baseband filter 422. The first baseband filter 420 and the second baseband filter 422 are coupled to a baseband (BB) phase interpolator 430. The baseband phase interpolator 430 is coupled to the HRM 470.

The transmitter 400-2 further includes an oscillator 440 coupled to a divider 450. The divider 450 is coupled to a local oscillator (LO) phase interpolator 460. The LO phase interpolator 460 is coupled to the HRM 470 and produces signals having a 12.5% duty cycle for operating in voltage mode and avoiding time overlapping of LO signals. The HRM 470 is coupled to a driver amplifier (DA) 480, and the DA 480 is coupled to a transformer 492.

A difference between operating the HRM 470 in current mode and voltage mode is that in current mode, the HRM 470 utilizes a 25% duty cycle, whereas in voltage mode, the HRM 470 utilizes a 12.5% duty cycle. As a result, in order for each HRM 470 to perform at its best, the HRM 470 of the transmitter 400-1 is terminated in a low impedance with the mixer output signal in the current domain. Conversely, the HRM 470 of the transmitter 400-2 is terminated in a high impedance with the mixer output signal in the voltage domain.

The voltage mode harmonic-rejection mixer is an improvement over the current mode HRM by omitting an area-inefficient transformer (e.g., first transformer 490). Nevertheless, operating in voltage mode involves a reduced 12.5% duty cycle for avoiding signal overlap, which is less desirable than a 25% duty cycle because it is difficult to generate a pulse at 12.5%. It would therefore be desirable to operate at a 25% duty cycle. Additionally, the baseband phase interpolator 430 is area inefficient.

As described above, conventional transmitters use two DACs for generating the I and Q baseband signals and also use resistive phase interpolators for processing the I and Q baseband signals. However, resistive phase interpolators are area-inefficient on a chip, and phase interpolation creates voltage loss. It is therefore desirable to implement a transmitter that is area efficient and reduces voltage loss.

Aspects of the present disclosure describe a transmitter having a first pair of digital-to-analog converters (DACs) coupled to an input of a first mixer. The first pair of DACs may be configured to generate first baseband signals. A second pair of DACs may be coupled to an input of a second mixer. The second pair of DACs may be configured to generate second baseband signals. The second baseband signals may be shifted in phase relative to the first baseband signals.

Figure 5A:
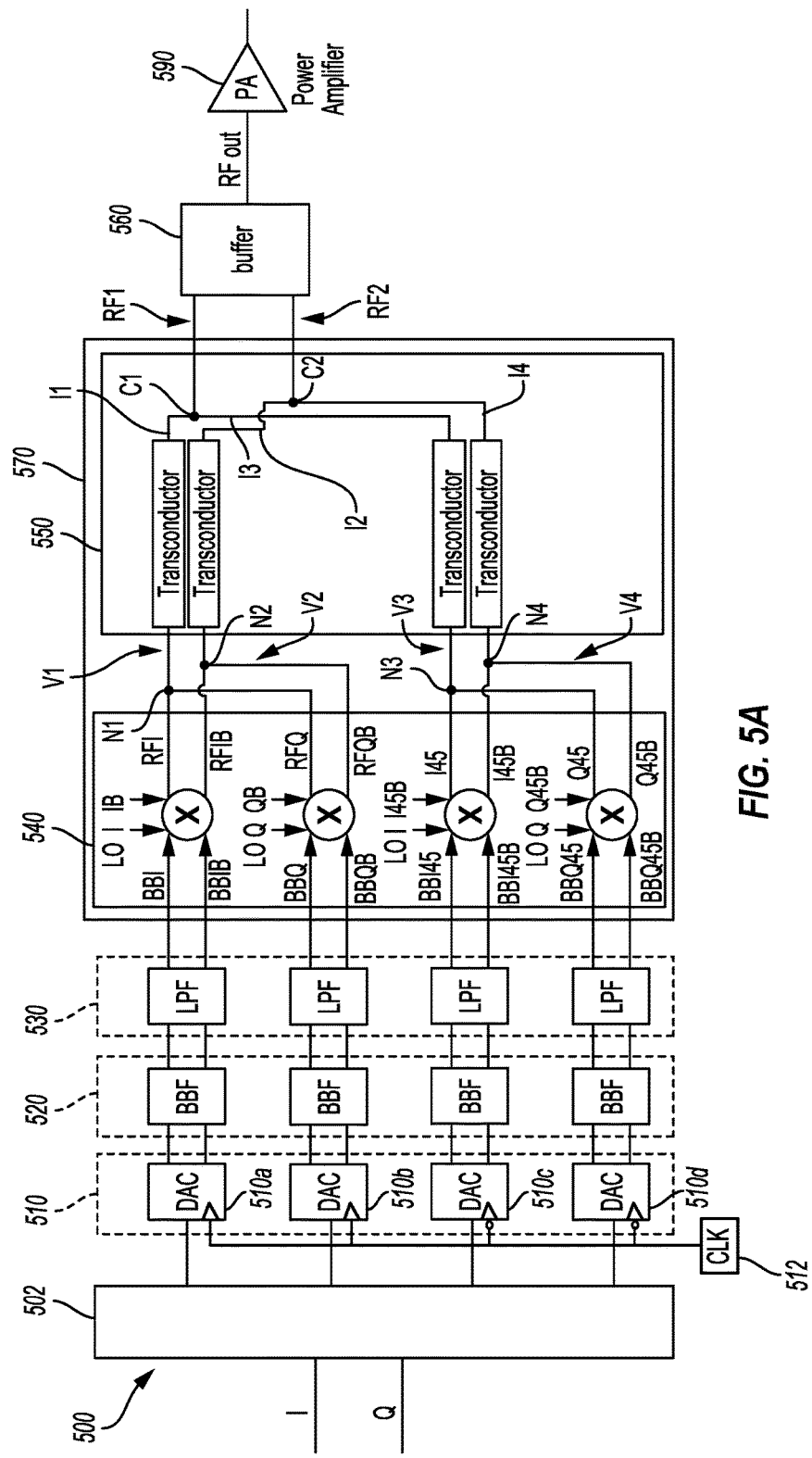
FIG. 5A is a block diagram illustrating an exemplary implementation of a transmitter including a voltage-mode harmonic-rejection mixer (HRM), according to aspects of the present disclosure.

FIG. 5A is a block diagram illustrating an exemplary implementation of a transmitter 500 (e.g., a communication circuit) including a voltage-mode harmonic-rejection mixer (HRM) 570, according to aspects of the present disclosure. The transmitter 500 may include I and Q signals input into a phase generator 502. The phase generator 502 may be configured to distribute the I signal to a digital-to-analog converter (DAC) and the Q signal to another DAC 510. According to an aspect of the present disclosure, the DACs 510 may each receive a digital signal and output a differential analog signal. For example, the DACs 510 may include current mode DACs that receive digital signals and produce analog current signals based on the received digital signal.

The DACs 510 may be coupled to baseband filters (BBFs) 520. For example, the baseband filters 520 may include a first pair of baseband filters (BBFs) and a second pair of baseband filters. The BBFs 520 may include transimpedance amplifiers (TIAs). The BBFs 520 may have a current mode input and a voltage mode output. Each baseband filter may include a resistor-capacitor (RC) filter. The baseband filters 520 may be coupled to passive low pass filters (LPFs) 530. The LPFs 530 may be coupled to mixers 540. For example, the mixers 540 may combine filtered versions of differential signals generated by the DACs 510 with LO differential signals. The mixers 540 may include a first pair of mixers and a second pair of mixers. The mixers 540 may be voltage mode mixers that receive a voltage mode baseband signal and produce a voltage mode radio frequency (RF) signal. According to an aspect of the present disclosure, the mixer 540 are passive mixers.

Outputs of the mixers 540 are summed and processed through transconductors 550. The transconductors 550 may include a first pair of transconductors and a second pair of transconductors. For example, the outputs of the mixers 540 may be summed as voltages. According to an aspect of the present disclosure, the HRM 570 may include the mixers 540 and the transconductors 550. Outputs of the transconductors 550 may be summed as currents and processed through a buffer 560. The buffer 560 may output an RF signal to a power amplifier 590 for transmitting.

According to an aspect of the present disclosure, the mixers 540 may be configured to generate voltage mode outputs. Voltage nodes N1-N4 may be configured to sum the voltage mode outputs produced by the mixers 540 to generate intermediate voltage mode signals V1-V4 (e.g., a first pair of intermediate voltage mode signals and a second pair of intermediate voltage mode signals). The transconductors 550 may be configured to convert the intermediate voltage mode signals V1-V4 to intermediate current mode signals I1-I4 (e.g., a first pair of intermediate current mode signals and a second pair of intermediate current mode signals). Current nodes C1, C2 (e.g., at least one current node) may be configured to sum the intermediate current mode signals I1-I4 to generate mixer output signals RF1, RF2 (e.g., at least one mixer output signal).

According to additional aspects of the present disclosure, the voltage nodes N1-N4 may include the first voltage node N1 coupled to a first pair of the mixers 540. The first voltage node N1 may be configured to sum in-phase (I) (labeled RFI in FIG. 5A) and quadrature-phase (Q) (labeled RFQ in FIG. 5A) signals. The second voltage node N2 may be coupled to the first pair of the mixers 540. The second voltage node N2 may be configured to sum Ibar (RFIB) and Qbar (RFQB) signals. The third voltage node N3 may be coupled to a second pair of the mixers 540. The third voltage node N3 may be configured to sum I45 (RFI45) and Q45 (RFQ45) signals. The fourth voltage node N4 may be coupled to the second pair of the mixers 540. The fourth voltage node N4 may be configured to sum IB45 (RFI45B) and QB45 (RFQ45B) signals.

According to an aspect of the present disclosure, outputs of the mixers 540 may be coupled to each other through a short duty cycle local oscillator (LO) pulse (e.g., a narrow LO duty cycle).

Advantages of the HRM 570 include elimination of area inefficient phase interpolators and transformers. Additionally, the HRM 570 may operate using a 25% duty cycle, which is advantageous for signal generation.

According to additional aspects of the present disclosure, each DAC 510a-510d may be controlled by a sampling clock (CLK) 512. For example, the I and Q signals distributed to a first DAC 510a and a second DAC 510b may each be clocked on a rising edge (e.g., a leading edge) of the sampling CLK 512. The signals distributed to a third DAC 510c and a fourth DAC 510d may each be clocked on a falling edge of the sampling CLK 512. The input signals for the third DAC 510c and the fourth DAC 510d are each derived from both the I signal and the Q signal. In this way, the I and Q signals may be offset time-wise from each other, or otherwise interleaved. The sampling CLK 512 may be a latching clock.

Advantages of offsetting (e.g., interleaving) the I and Q signals include allowing the DACs 510 to run on a sampling clock (e.g., a sampling clock signal) at half of a frequency of a non-offset (e.g., non-interleaved) implementation. This saves power and also cancels LO+3BB and LO+5BB distortion harmonics. Additionally, images having half a frequency of the sampling clock frequency are canceled.

Figure 5B:
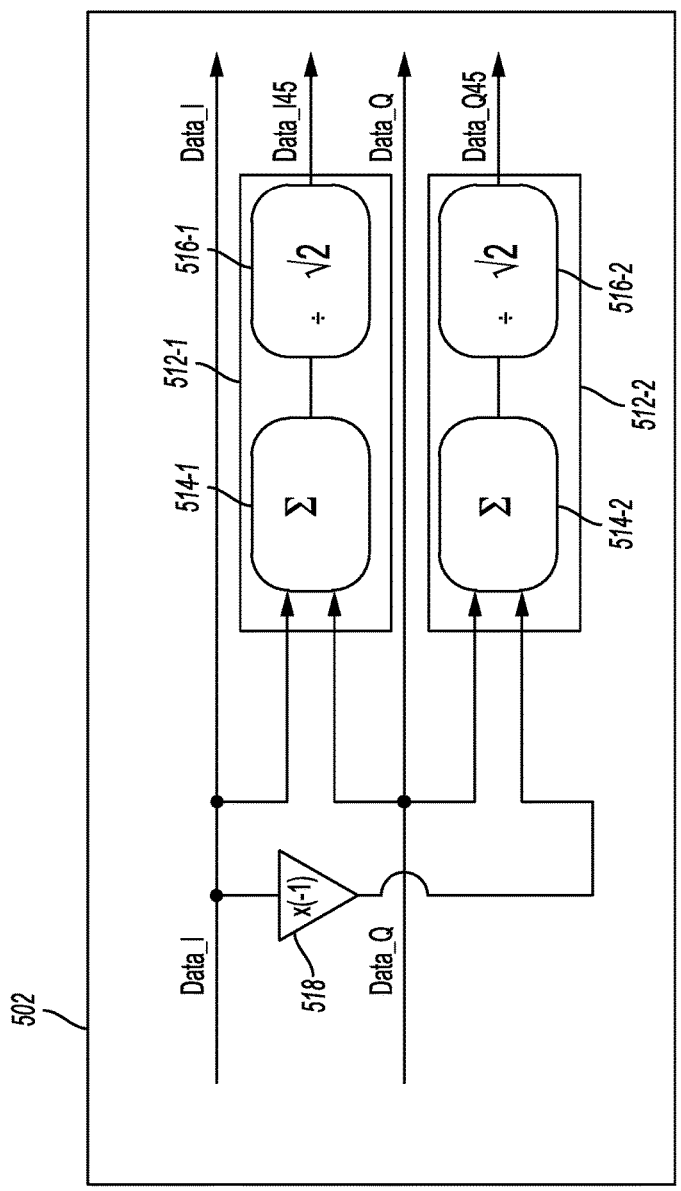
FIG. 5B is a block diagram illustrating a phase generator of the transmitter of FIG. 5A, according to aspects of the present disclosure.

FIG. 5B is a block diagram illustrating the phase generator 502 of FIG. 5A, according to aspects of the present disclosure. For example, the phase generator 502 may be configured to receive in-phase (I) and quadrature-phase (Q) baseband signals Data_I and Data_Q (e.g., digital baseband data) and output Data_I45 (e.g., a first new component of baseband data) and Data_Q45 (e.g., a second new component of baseband data) signals in addition to the Data_I and Data_Q signals. Data_I45 (e.g., a first new component) may be different from Data_Q45 (e.g., a second new component). For example, the Data_I45 signal may be phase shifted by 45 degrees relative to the Data_I signal (e.g., the I component), and the Data_Q45 signal may be phase shifted by 45 degrees relative to the Data_Q signal (e.g., the Q component). The output signals may be single-ended or differential.

According to aspects of the present disclosure, the phase generator 502 may include a first phase generator 512-1 and a second phase generator 512-2. The first phase generator 512-1 may include a first summer 514-1 and a first divider 516-1, and the second phase generator 512-2 may include a second summer 514-2 and a second divider 516-2.

In operation, the input Data_I and Data_Q signals may be processed by the first phase generator 512-1 to output the Data_I45 signal. The input Data_I and Data_Q signals may also be processed by the second phase generator 512-2 to output the Data_Q45 signal. For example, the first summer 514-1 may be configured to sum the Data_I and Data_Q signals. The sum of the Data_I and Data_Q signals may then be scaled by $\sqrt{2}$ by the first divider 516-1 to generate the Data_I45 signal. Similarly, the second summer 514-2 may be configured to sum a negative value of the Data_I signal with the Data_Q signal. For example, the Data_I signal may be multiplied by negative one at an inverter 518 to generate the negative Data_I signal prior to summing. The sum of the negative Data_I signal and the Data_Q signal may then be scaled by $\sqrt{2}$ by the second divider 516-2 to generate the Data_Q45 signal. According to additional aspects of the present disclosure, the Data_Q signal may be processed by the inverter 518 instead of the Data_I signal.

Figure 6A:
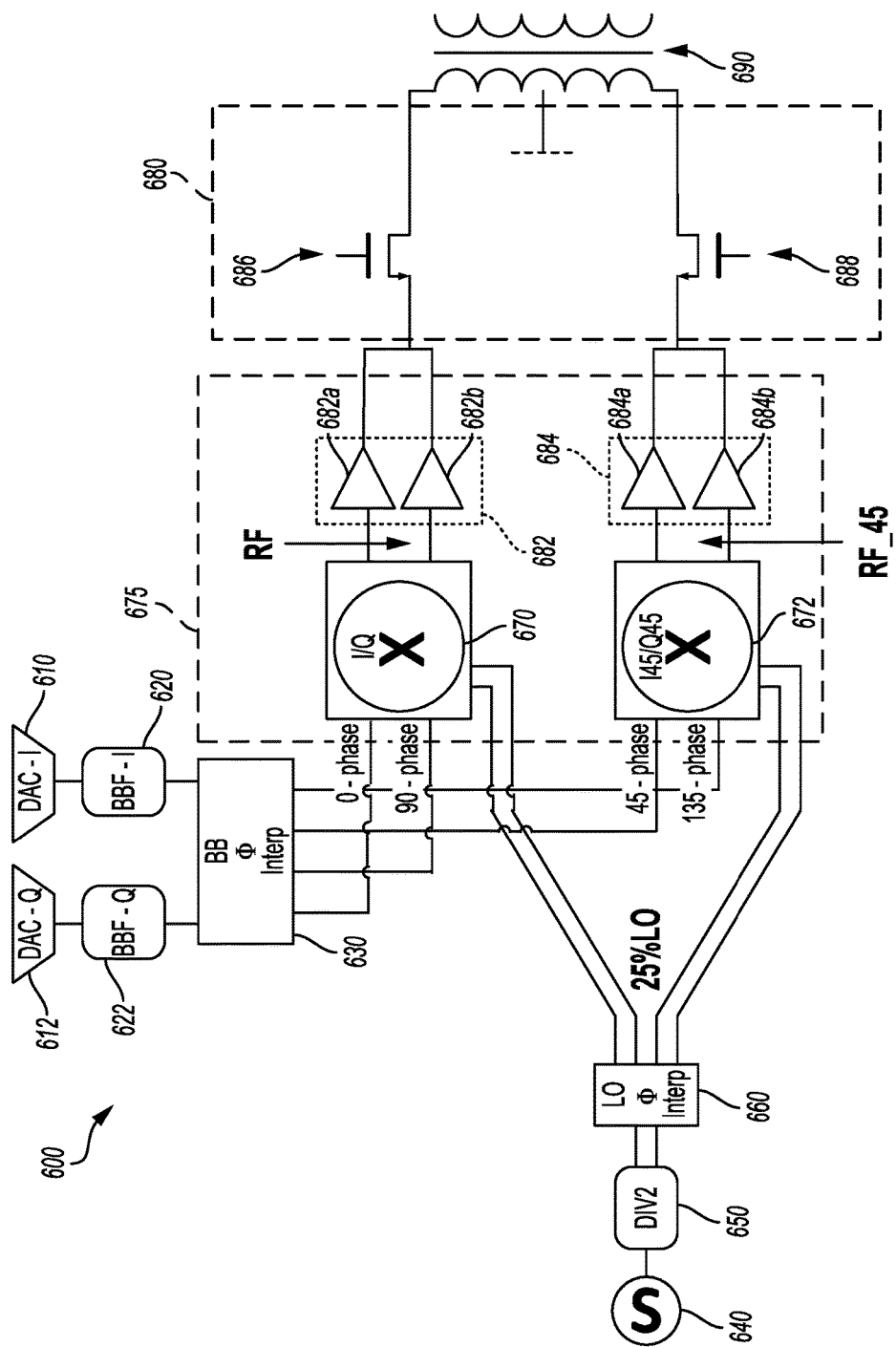
FIG. 6A is a block diagram illustrating an exemplary implementation of a transmitter including a voltage-mode harmonic-rejection mixer (HRM), according to aspects of the present disclosure.

FIG. 6A is a block diagram illustrating an exemplary implementation of a communication circuit 600 including a voltage mode harmonic-rejection mixer (HRM) 675, according to aspects of the present disclosure. The communication circuit 600 may include a first pair of digital-to-analog converters (DACs) 610 and 612. For example, the first DAC 610 may generate an in-phase (I) signal, and the second DAC 612 may generate a quadrature-phase (Q) signal. The first pair of DACs 610 and 612 may be coupled to a first pair of baseband (BB) filters (BBF) 620 and 622. For example, the first baseband filter 620 may process an in-phase signal from the first DAC 610, and the second baseband filter 622 may process a quadrature-phase signal from the second DAC 612. The first pair of baseband filters 620 and 622 may be coupled to a baseband phase interpolator 630. For example, the baseband phase interpolator 630 may use resistive baseband phase interpolation to generate additional baseband phases.

According to an aspect, the baseband phase interpolator 630 may generate a first pair of baseband signals and a second pair of baseband signals. For example, the first pair of baseband signals may be in-phase (I) signals and quadrature-phase (Q) signals that are shifted zero and 90 degrees. In addition, the second pair of baseband signals may be in-phase (I) signals and quadrature-phase (Q) signals that are shifted 45 and 135 degrees. The first pair of baseband signals may be input into a first mixer 670, and the second pair of baseband signals may be input into a second mixer 672.

The communication circuit 600 may also include a local oscillator (LO) 640. The LO 640 may be coupled to a divider 650, and the divider 650 may be coupled to an LO phase interpolator 660. The LO phase interpolator 660 may generate a first pair of LO signals and a second pair of LO signals. For example, the first pair of LO signals may be in-phase (I) signals and quadrature-phase (Q) signals that are shifted zero and 90 degrees. The second pair of LO signals may be in-phase (I) signals and quadrature-phase (Q) signals that are shifted 45 and 135 degrees. The first pair of LO signals may be input into the first mixer 670, and the second pair of LO signals may be input into the second mixer 672. The generated LO signals may be differential.

According to an aspect of the present disclosure, the 45 and 135-degree shifts of the baseband (BB) signals and the local oscillator (LO) signals may be generated through the baseband phase interpolator 630 and the LO phase interpolator 660, respectively. For example, the LO and baseband signals naturally occur in zero and 90-degree phase shifts. Each of the phase interpolators (e.g., 630 and 660) generates intermediate phases by using these naturally occurring zero and 90-degree phase shifts. For example, each phase interpolator may include delay lines that delay each signal enough to generate, for example, a 45-degree shift.

According to additional aspects, the baseband signals may be shifted in phase relative to each other by 180 degrees divided by a number of baseband phases not including complementary baseband phases. For example, for three (3) baseband phases, the phase shift would be 60 degrees, and for four (4) baseband phases, the phase shift would be 45 degrees, etc. Similarly, the LO signals may be shifted in phase relative to each other by 180 degrees divided by a number of LO phases not including complementary LO phases. For example, for three (3) LO phases, the phase shift would be 60 degrees, and for four (4) LO phases, the phase shift would be 45 degrees, etc. The baseband and LO phases may be I, Q, I45, and Q45, and their complementary phases may be IB, QB, I45B, and Q45B, as shown in FIGS. 5A and 6A.

According to an aspect, the divider 650 facilitates generation of zero and 90-degree phases, and the LO phase interpolator 660 further delays the signal by 45 degrees. According to an aspect, 180 degrees is generated by flipping zero degrees, and 225 degrees (e.g., 45 degrees+180 degrees) is generated by flipping 45 degrees.

The LO phase interpolator 660 may operate at a 25% duty cycle. Of course, this duty cycle is exemplary only, and other duty cycles are permitted. For example, the LO 640 may be configured to generate a duty cycle inversely proportional to a number of phases of the second mixer 672, not including complementary phases. The phases may be I, Q, I45, and Q45, and the complementary phases may be IB, QB, I45B, and Q45B, as shown in FIGS. 5A and 6A. The duty cycle may be determined by 100% divided by a full period (e.g., a number of LO phases) of the second mixer 672 (e.g., a doubly-balanced mixer). For example, for a doubly-balanced mixer having a full period of three (3), corresponding to three phases, the duty cycle is 100% divided by 3, or 33%. As another example, for a doubly-balanced mixer having a full period of four (4), corresponding to four phases, the duty cycle is 100% divided by 4, or 25%. In this way, there is no overlap in the duty cycle when the second mixer 672 is coupled to the LO phase interpolator 660. According to an aspect, the communication circuit 600 may be configured to operate with an even number of phases.

According to additional aspects, rather than generating a first pair and a second pair of baseband (BB) signals and/or LO signals, multiple first baseband and/or LO signals (e.g., a first plurality) and multiple baseband and/or LO second signals (e.g., a second plurality) may be generated. For example, three or more baseband and LO signals may be generated.

According to an aspect, the first mixer 670 mixes the first pair of baseband signals with the first pair of LO signals and outputs a first radio frequency (RF) signal to a driver amplifier (DA) 680. Additionally, the second mixer 672 mixes the second pair of baseband signals with the second pair of LO signals and outputs a second RF signal to the driver amplifier 680. For example, the second RF signal may be shifted 45 degrees relative to the first RF signal. According to an aspect, the baseband signals may be interleaved with the LO signals. For example, a first signal of the second pair is shifted less than a second signal of the first pair.

The first mixer 670 may be coupled to a first pair of transconductors 682. In addition, the second mixer 672 may be coupled to a second pair of transconductors 684. For example, the first pair of transconductors 682 may include a first transconductor 682a and a second transconductor 682b. Additionally, the second pair of transconductors 684 may include a third transconductor 684a and a fourth transconductor 684b. According to aspects of the present disclosure, the HRM 675 may include the first mixer 670, the second mixer 672, the first pair of transconductors 682, and the second pair of transconductors 684.

According to an aspect, the first transconductor 682a may receive a first voltage from the first mixer 670 and output a first current based on the first voltage. The first transconductor 682a may have a high input impedance. For example, the magnitude of the input impedance may be more than a few hundred ohms at a frequency of operation. The second transconductor 682b may receive a second voltage from the first mixer 670 and output a second current based on the second voltage. The second transconductor 682b may also have a high input impedance. For example, the magnitude of the input impedance may be more than a few hundred ohms at a frequency of operation.

Similarly, according to an additional aspect, the third transconductor 684a may receive a third voltage from the second mixer 672 and output a third current based on the third voltage. The third transconductor 684a may have a high input impedance, such as more than a few hundred ohms at a frequency of operation. The fourth transconductor 684b may receive a fourth voltage from the second mixer 672 and output a fourth current based on the fourth voltage. The fourth transconductor 684b may also have a high input impedance, such as more than a few hundred ohms at a frequency of operation.

The first pair of transconductors 682 may be coupled to a first driver amplifier cascode device 686 (e.g., a first cascode device), and the second pair of transconductors 684 may be coupled to a second driver amplifier cascode device 688 (e.g., a second cascode device). For example, outputs of the first transconductor 682a and the second transconductor 682b may be coupled to an input of the first driver amplifier cascode device 686, and outputs of the third transconductor 684a and the fourth transconductor 684b may be coupled to an input of the second driver amplifier cascode device 688. An output of the driver amplifier 680 may be coupled to a transformer 690. The transformer 690 may be configured to combine the output currents of the first pair of transconductors 682 and the second pair of transconductors 684. For example, the transformer 690 combines the output currents of first transconductor 682a, second transconductor 682b, third transconductor 684a, and fourth transconductor 684b.

According to an additional aspect, copies of the signals from the first mixer 670 and the second mixer 672 may be converted to a current through the first pair of transconductors 682 and the second pair of transconductors 684, respectively. Additionally, the first driver amplifier cascode device 686 and the second driver amplifier cascode device 688 may combine the current from the first pair of transconductors 682 and the second pair of transconductors 684. For example, the first pair of transconductors 682 and the second pair of transconductors 684 convert a voltage appearing at a gate of each transconductor 682a, 682b, 684a, 684b into a current. The current may then be summed at drains of the first pair of transconductors 682 and the second pair of transconductors 684, and output to each cascode device 686, 688.

According to aspects of the present disclosure, outputs of the DACs 610, 612, baseband filters 620, 622, baseband phase interpolator 630, LO phase interpolator 660, first mixer 670, and second mixer 672 are differential.

The voltage RF signal output from each mixer 670, 672 is converted to current using one of the transconductors of the driver amplifier 680. In doing so, it does not add any additional electromagnetic components because the HRM 675 utilizes the driver amplifier 680 that is already present, while eliminating the transformer. In this way, voltage is converted to current without employing a transformer. This takes advantage of the pre-existing ability to convert voltage to current through the CS stage that is already present in the driver amplifier 680. Another advantage is that it leverages use of an existing cascode device, which is also used for gain control and reliability of the driver amplifier. This allows for operating an HRM at a 25% duty cycle in voltage mode because signal addition is achieved in the current domain by adding the signals in the driver amplifier 680, rather than a transformer.

According to an additional aspect of the present disclosure, each of the cascode devices 686, 688 is configured to control a gain for the driver amplifier 680. For example, for maximum gain, all the cascode devices 686, 688 may be biased so that the first pair of transconductors 682 and the second pair of transconductors 684 are turned on. For minimum gain, all the cascode devices 686, 688 may be biased with voltages of their gates pulled down low so that they block output signals of the first pair of transconductors 682 and the second pair of transconductors 684 from appearing at the output. Additionally, the cascode devices 686, 688 allow for the summation of the current by presenting a low impedance. For example, a magnitude of the impedance may be more than a few tens of ohms at a frequency of operation.

The combination of the two mixers 670, 672 and the first pair of transconductors 682 and the second pair of transconductors 684 is essentially a four-phase mixer. Each phase may have a corresponding complementary phase. For example, the four phases may be I, Q, I45, and Q45, and the complementary phases may be IB, QB, I45B, and Q45B, as shown in FIGS. 5A and 6A. According to an aspect, each mixer 670, 672 may include an I and Q sub-mixer within it. In this way, many more mixers (e.g., more than two) may be implemented for mixing more signals. For example, the HRM 675, in voltage mode, has a voltage at all three ports of each mixer 670, 672 that is substantially similar. Voltages at baseband inputs, the LO inputs, and the RF outputs may be substantially similar.

Figure 6B:
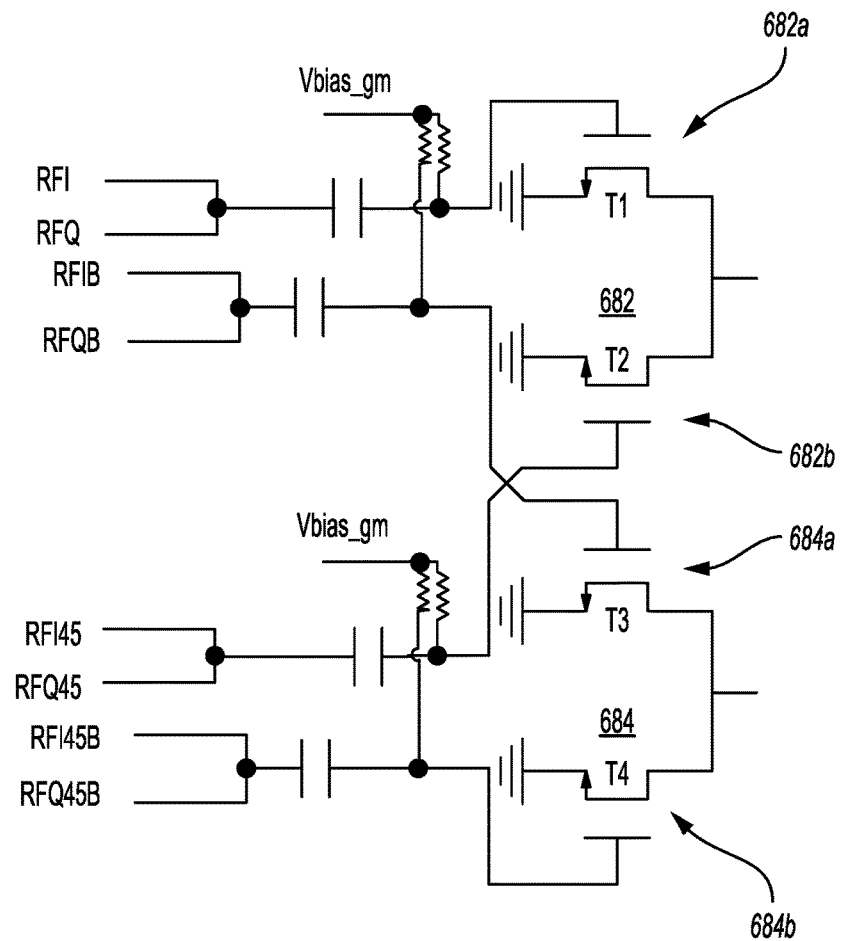
FIG. 6B is an exemplary circuit diagram of transconductors of FIG. 5A, according to aspects of the present disclosure.

FIG. 6B is an exemplary circuit diagram of the transconductors 550 of FIG. 5A, according to aspects of the present disclosure. It is understood that this circuit diagram is exemplary only, and other configurations are possible. For example, the transconductors 550 of FIG. 5A may include the first pair of transconductors 682 and the second pair of transconductors 684. The first pair of transconductors 682 may include the first transconductor 682a and the second transconductor 682b, and the second pair of transconductors 684 may include the third transconductor 684a and the fourth transconductor 684b. Each of the transconductors 682a, 682b, 684a, 684b may be implemented as a transistor. For example, the first transconductor 682a may be a first transistor T1, the second transconductor 682b may be a second transistor T2, the third transconductor 684a may be a third transistor T3, and the fourth transconductor 684b may be a fourth transistor T4.

A drain of the first transistor T1 may be coupled to a drain of the second transistor T2, and a drain of the third transistor T3 may be coupled to a drain of the fourth transistor T4. The sources of all the transistors T1-T4 may be coupled to ground. The outputs of the first transistor T1 and the second transistor T2 may be coupled to the first driver amplifier cascode device 686 (as shown in FIG. 6A), and the outputs of the third transistor T3 and the fourth transistor T4 may be coupled to the second driver amplifier cascode device 688.

According to an aspect, a gate of the first transistor T1 may be coupled to a first output voltage of the first mixer 670 (as shown in FIG. 6A), and a gate of the third transistor T3 may be coupled to a second output voltage of the first mixer 670. Additionally, a gate of the second transistor T2 may be coupled to a third output voltage of the second mixer 672 (as shown in FIG. 6A), and a gate of the fourth transistor T4 may be coupled to a fourth output voltage of the second mixer 672. In this way, the first pair of transconductors 682 may be cross-coupled with the second pair of transconductors 684.

Figure 7:
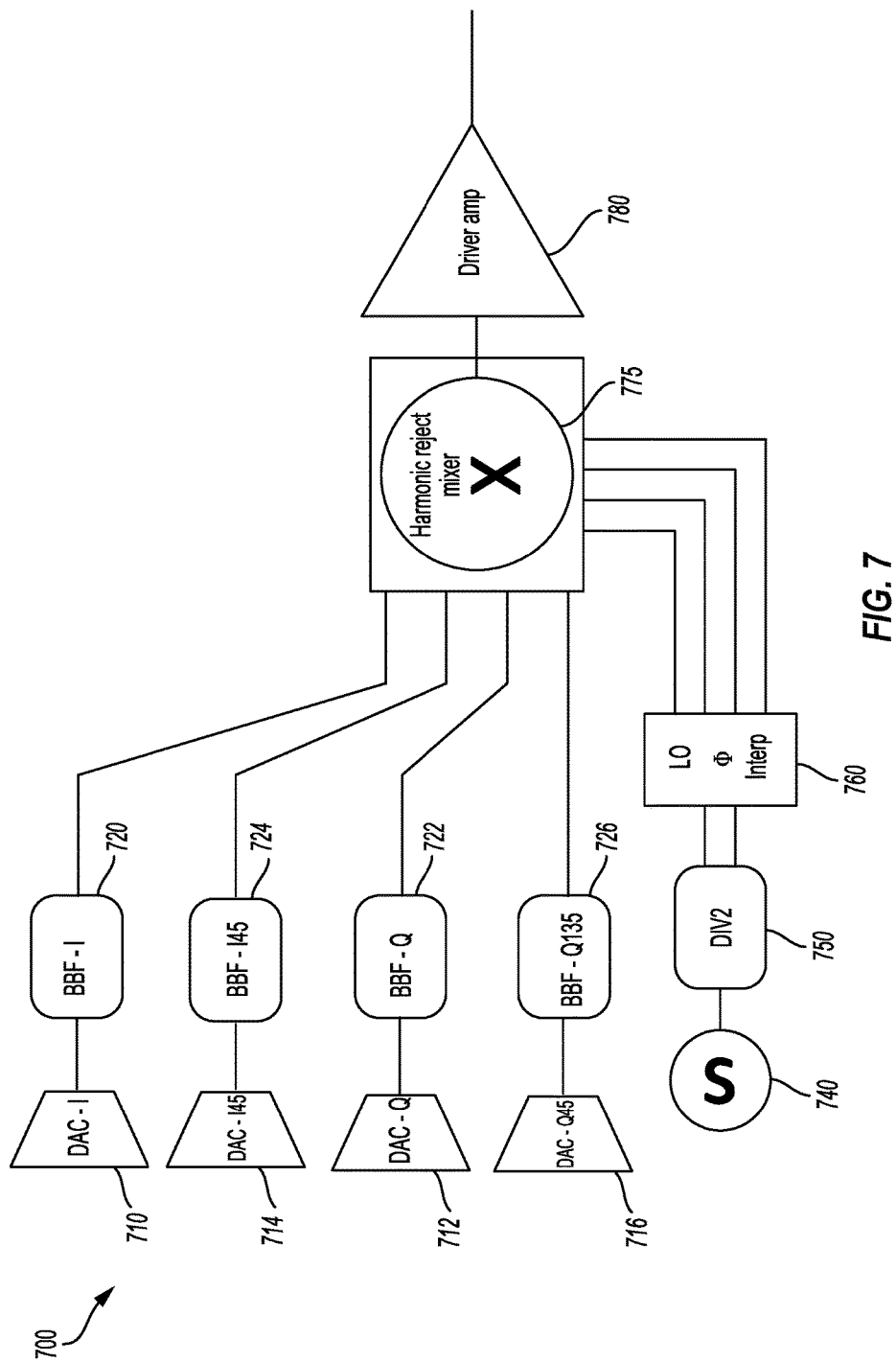
FIGS. 7 and 8 are block diagrams illustrating exemplary implementations of the transmitter of FIGS. 5A and 6A, according to aspects of the present disclosure.

FIG. 7 is a block diagram illustrating an exemplary implementation of a communication circuit 700 including a voltage mode harmonic-rejection mixer (HRM) 775, according to aspects of the present disclosure. In this configuration, a baseband phase interpolator may be removed and replaced with multiple digital-to-analog converters (DACs) and baseband filters (BBFs).

The communication circuit 700 may include a first pair of DACs 710 and 712. For example, the first DAC 710 may be in-phase (I) and the second DAC 712 may be quadrature-phase (Q). The first pair of DACs 710 and 712 may be coupled to a first pair of baseband (BB) filters (BBFs) 720 and 722. For example, the first baseband filter 720 may process an in-phase signal from the first DAC 710. In addition, and the second baseband filter 722 may process a quadrature-phase signal from the second DAC 712. The first pair of baseband filters 720 and 722 may be coupled to the HRM 775.

The communication circuit 700 may further include a second pair of digital-to-analog converters (DACs) 714 and 716. For example, the third DAC 714 may be in-phase and the fourth DAC 716 may be quadrature-phase. The second pair of DACs 714 and 716 may be coupled to a second pair of baseband filters (BBFs) 724 and 726. For example, a third baseband filter 724 may process an in-phase signal from the third DAC 714, and a fourth baseband filter 726 may process a quadrature-phase signal from the fourth DAC 716. The second pair of baseband filters 724 and 726 may be coupled to the HRM 775.

The first pair of baseband filters 720 and 722 may generate a first pair of baseband signals, and the second pair of baseband filters 724 and 726 may generate a second pair of baseband signals. For example, the first baseband filter 720 may generate a baseband signal of zero degrees, and the second baseband filter 722 may generate a shifted baseband signal of 90 degrees. Additionally, the third baseband filter 724 may generate a shifted baseband signal of 45 degrees, and the fourth baseband filter 726 may generate a shifted baseband signal of 135 degrees. The first and second pair of baseband signals may be input into the HRM 775.

As described above in relation to FIG. 5A, four phases may be generated by four DACs. In FIG. 6A, the same four phases may be generated by two DACs and an interpolator. Regardless of how the phases are generated, the mixers described in relation to FIGS. 5A and 6A are interchangeable. According to an aspect of the present disclosure, the baseband phase interpolator 630 of the communication circuit 600 in FIG. 6A may be replaced with a resistor-capacitor (RC) filter, which reduces die area of the communication circuit 700.

The communication circuit 700 may also include a local oscillator (LO) 740. The LO 740 may be coupled to a divider 750, and the divider 750 may be coupled to an LO phase interpolator 760. The LO phase interpolator 760 may generate a first pair of LO signals and a second pair of LO signals. For example, the first pair of LO signals may be in-phase (I) signals and quadrature-phase (Q) signals that are shifted zero and 90 degrees, and the second pair of LO signals may be in-phase (I) signals and quadrature-phase (Q) signals that are shifted by 45 and 135 degrees. The first and second pair of LO signals may be input into the HRM 775.

The HRM 775 may include multiple phases input into its LO port, along with an efficient number of phases to suppress a desired number of harmonics. Additionally, the baseband filters 720, 722, 724, 726 may be coupled to a baseband phase generation system. For example, the phases may be generated by having independent copies of each DAC signal, where each of the DACs 710, 712, 714, 716 is configured to generate one of the desired phases. Each desired phase may be coupled with an independent baseband filter that processes the signal from each DAC 710, 712, 714, 716. Splitting the signal with the DACs yields a favorable resistance capacitance (RC) constant in each of the baseband filters 720, 722, 724, 726.

Advantages of the communication circuit 700 include generating multiple baseband phases for the HRM 775 by multiple DACs 710-716, rather than a baseband phase interpolator. This reduces die area by eliminating electromagnetic components and also reduces costs by eliminating the baseband phase interpolator for generating the baseband phases.

Figure 8:
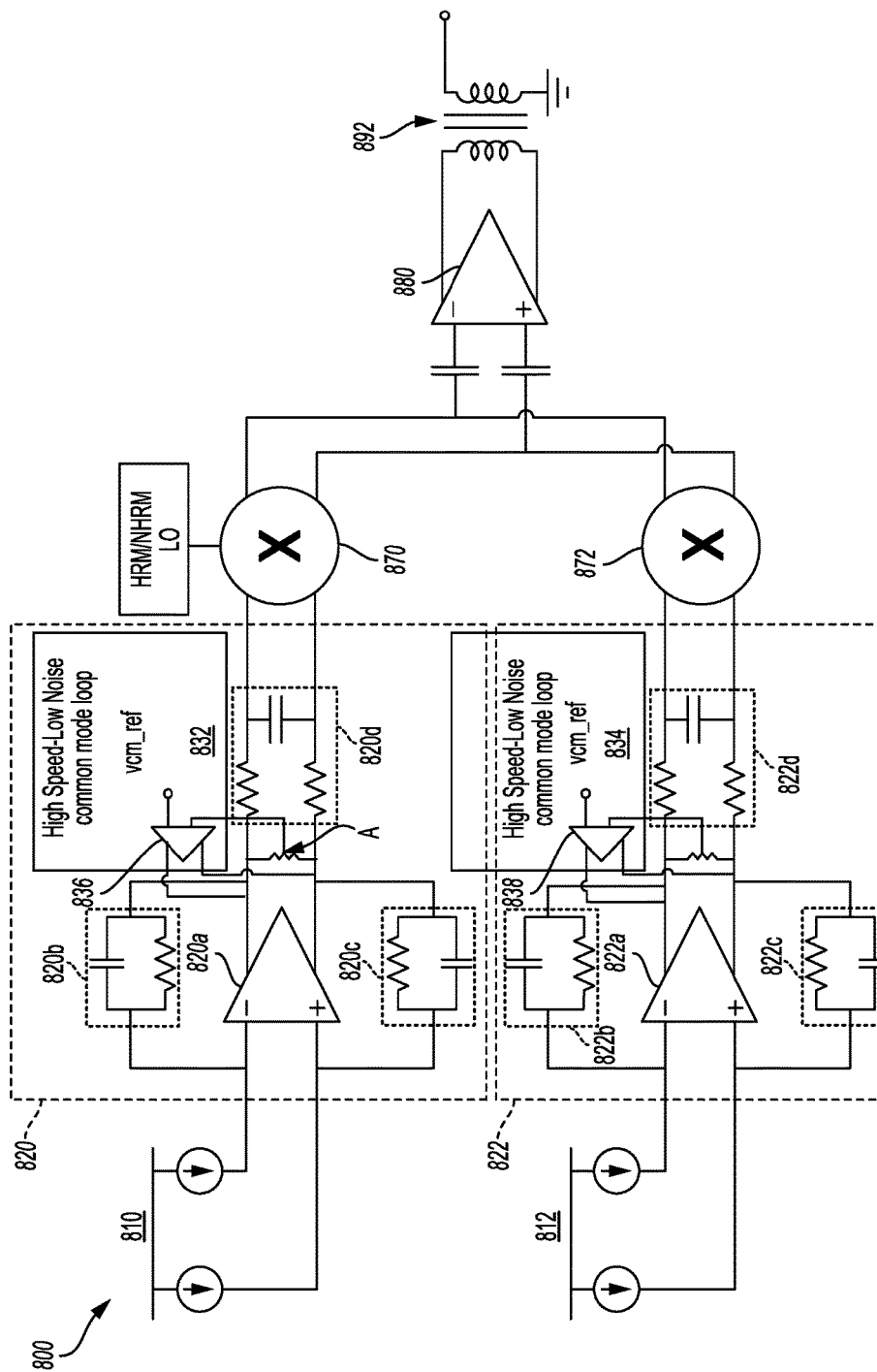

FIG. 8 is a block diagram illustrating an exemplary implementation of a communication circuit 800 of the harmonic-rejection mixers (HRMs) of FIGS. 5A, 6A, and 7, including common mode loops 832, 834, according to aspects of the present disclosure. The communication circuit 800 may include a first pair of digital-to-analog converters (DACs) 810 and 812 coupled to a first pair of baseband (BB)

filters (BBFs) 820 and 822. For example, DACs 810 and 812 may receive digital inputs and may output differential signals. It is noted that FIG. 8 illustrates a top half of communication circuit 800 in the HRMs of FIGS. 5A, 6A, and 7. It is understood that the bottom half of communication circuit 800 is substantially similar to the top half of communication circuit 800 in the HRMs of FIGS. 5A, 6A, and 7.

One baseband filter of the pair of baseband filters 820, 822 may be a differential operational amplifier, such as a transimpedance amplifier. For example, the baseband filter 820 may include a first transimpedance amplifier 820a coupled to resistor-capacitor (RC) elements 820b and 820c and low pass filter 820d. The second baseband filter 822 may include a second transimpedance amplifier 822a coupled to RC elements 822b and 822c and the low pass filter 822d. The first pair of baseband filters 820 and 822 may be coupled to a pair of mixers 870 and 872. The pair of mixers 870 and 872 may be coupled to a driver amplifier (DA) 880, and the DA 880 may be coupled to a transformer 892.

According to an aspect of the present disclosure, each baseband filter 820 and 822 may include a first high speed-low noise common mode loop 832 (e.g., first common mode circuitry) and a second high speed-low noise common mode loop 834 (e.g., second common mode circuitry) for reducing noise at an output of a baseband filter. The first loop 832 may be configured to impose a first common mode voltage on outputs of the first baseband filter 820. The second loop 834 may be configured to impose a second common mode voltage on outputs of the second baseband filter 822.

The first baseband filter 820 may include a first transimpedance amplifier (TIA) 820a coupled to the first loop 832, and the second baseband filter 822 may include a second TIA 822a coupled to the second loop 834. Each of the first loop 832 and second loop 834 may include a feedback operational amplifier with a first input that is the common mode voltage of an output of the first baseband filter 820 and the common mode voltage of an output of the second baseband filter 822, respectively. Each operational amplifier also includes a reference voltage (vcm_ref) as a second input. The first loop 832 and the second loop 834 suppress harmonics of each of the first baseband filter 820 and the second baseband filter 822. Additionally, the first loop 832 and the second loop 834 have a wider bandwidth (BW) and a lower noise than conventional common mode loops. Advantages of the communication circuit 800 include lower noise at outputs of the pair of baseband filters 820 and 822.

According to aspects of the present disclosure, feedback operational amplifiers 836, 838 may be located adjacent to the baseband filters 820, 822. Feedback operational amplifiers 836, 838 may correct a common mode voltage by sensing the output common mode voltage and feeding it back. For example, a voltage at node A may be compared with a reference voltage vcm_ref. Based on the comparing, voltage outputs of operational amplifier 836 may be boosted up or throttled down by the loop 832. The outputs of the baseband filters 820, 822 ride on top of the common mode voltage imposed by first loop 832 and second loop 834. The feedback operational amplifiers 836, 838 may be coupled to output nodes of the baseband filters 820, 822.

Figure 9:
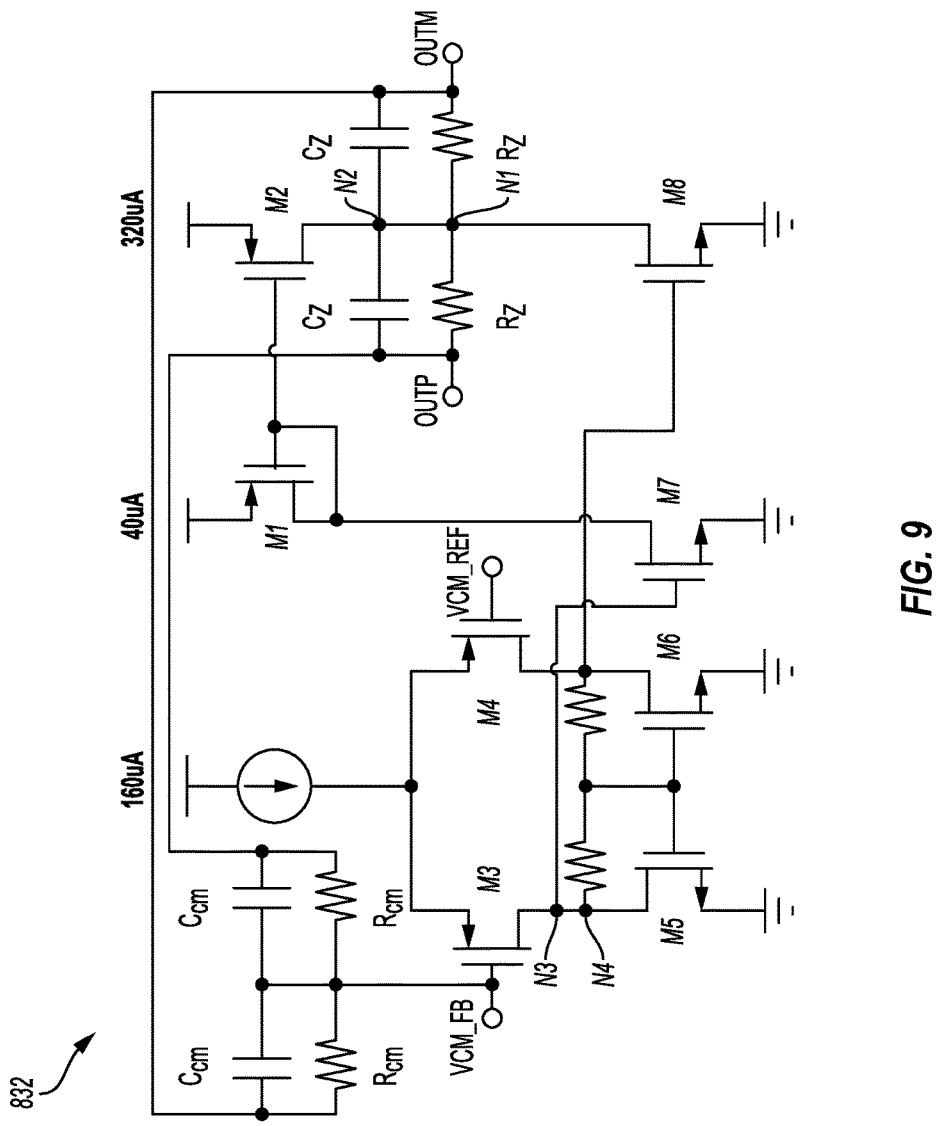
FIG. 9 is a block diagram of a common mode (CM) loop, according to aspects of the present disclosure.

FIG. 9 is a block diagram of the common mode (CM) loop 832 of the communication circuit 800 of FIG. 8, according to aspects of the present disclosure. The loop 832 may include transistors M1 and M2 coupled to each other at their gates. A drain of the transistor M1 may be coupled to the gate of the transistor M1 and a drain of the transistor M7. A source of the transistor M1 may be coupled to a voltage rail. A source of the transistor M2 may be coupled to a voltage rail.

A gate of transistor M7 may be coupled to a node N3 (e.g., a common mode sense node). A gate of transistor M8 may be coupled to a pair of resistors, a drain of transistor M6, a drain of transistor M5, node N3, and node N4. A drain of transistor M5 may be coupled to a drain of transistor M3, node N3, and node N4. A drain of transistor M6 may be coupled a drain of transistor M4. Sources of transistors M3 and M4 may be coupled to a third current source (e.g., 160 µA). A gate of transistor M3 may be coupled to VCM_FB, resistors Rcm, and capacitors Ccm. A gate of transistor M4 may be coupled to VCM_REF. The sources of transistors M5-M8 may be coupled to ground.

A drain of transistor M2 may be coupled to a drain of transistor M8 (e.g., a control transistor). The drain of transistor M8 may also be coupled to a pair of resistors Rz at node N1 and capacitors Cz at node N2. OUTP and OUTM nodes may be coupled to node N1 (e.g., a control node). The drains of transistors M2 and M8 may be isolated from OUTP and OUTM through nodes N1 and N2.

According to an aspect of the present disclosure, a zero results from resistors Rz and capacitors Cz, which results in a wider loop bandwidth. Because a total bandwidth of the common mode feedback loop 832 is set by non-dominant poles, adding zeros in the feedback network will cancel the non-dominant poles, and allow the loop 832 to operate at a high frequency (e.g., a frequency greater than or equal to the signal bandwidth) without being unstable. For example, Cz may cancel non-dominant poles.

According to an aspect, resistors Rz isolate nets that are present from a large swing on nodes OUTP and OUTM. Capacitor Ccm and sampling resistor Rcm further sample a voltage between nodes OUTP and OUTM, and the capacitor Ccm filters out the noise of the sampling resistor Rcm. For example, a voltage may be sampled at the node N3, which controls transistor M2 through transistor M1 and transistor M7. Additionally, the combination of transistors M2 and M8 may control a voltage at node N1 by pushing or pulling current to/from OUTP and OUTM nodes. For example, transistor M2 may push current to node N1, and transistor M8 may pull current from node N1. Because the loop 832 is only driving one branch, the loop 832 does not have a differential to single-ended conversion. That makes it easier to have a wide bandwidth (e.g., a frequency greater than or equal to the signal bandwidth), because transistors M2 and M8 create a push/pull scenario between them. As a result, the whole circuit is capable of pushing and pulling current.

According to an aspect, the loop 832 does not have a net directly connected to the sense point of the common mode feedback. For example, the active devices are connected to the output nets (e.g., OUTP and OUTM) through a resistor Rz to avoid seeing the full potential. The loop 832 may also include a cancellation of the pole in order to provide a wider bandwidth.

The voltage is controlled by a combination of transistors M2 and M8, which are configured to push or pull current to/from OUTP and OUTM nodes. In this way, both the top and bottom transistors are working together, which results in a faster, more responsive, loop.

As described, advantages of the disclosed harmonic-rejection mixers include the ability to operate in voltage mode while also using a 25% duty cycle of the LO. Area-efficient configurations are also discussed. Additionally, these configurations improve linearity without incurring signal loss.

Figure 10:
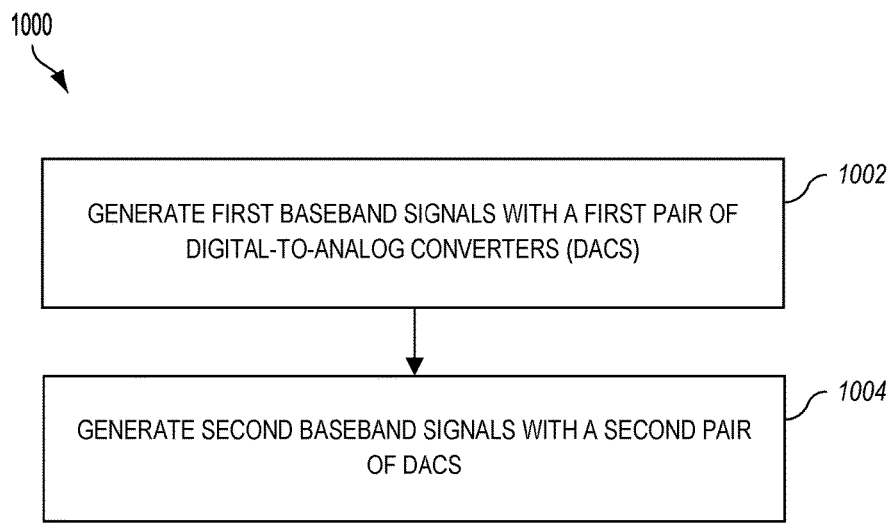
FIG. 10 is a flow diagram illustrating a method for communication, according to aspects of the present disclosure.

FIG. 10 is a flow diagram illustrating a method 1000 for communication, according to aspects of the present disclosure. At block 1002, first baseband signals are generated with a first pair of digital-to-analog converters (DACs). For example, multiple first baseband signals may be generated by multiple DACs, as shown in FIG. 5A.

At block 1004, second baseband signals may be generated with a second pair of DACs. For example, the second baseband signals may be shifted in phase relative to the first baseband signals.

According to aspects of the present disclosure, a transmitter is described. The transmitter may include first means for generating. The first generating means may include the first pair of digital-to-analog converters (DACs) 710 and 712 of FIG. 7. The transmitter may include second means for generating. The second generating means may include the second pair of DACs 714, 716 of FIG. 7. The transmitter may include first means for receiving. The first receiving means may include the first phase generator 512-1 of FIG. 5B. The transmitter may include second means for receiving. The second receiving means may include the second phase generator 512-2 of FIG. 5B. In another aspect, the aforementioned means may be any module or any apparatus or material configured to perform the functions recited by the aforementioned means.

Figure 11:
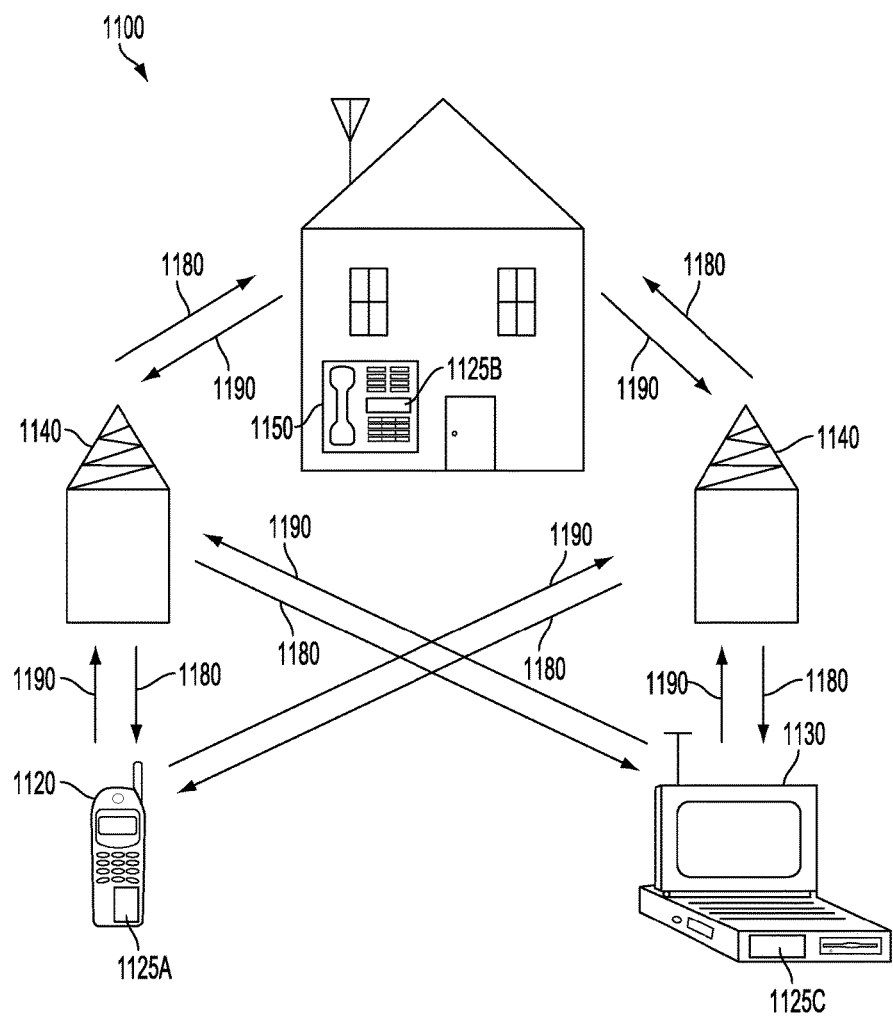
FIG. 11 is a block diagram showing an exemplary wireless communication system in which an aspect of the present disclosure may be advantageously employed.

FIG. 11 is a block diagram showing an exemplary wireless communication system 1100 in which an aspect of the present disclosure may be advantageously employed. For purposes of illustration, FIG. 11 shows three remote units 1120, 1130, and 1150 and two base stations 1140. It will be recognized that wireless communication systems may have many more remote units and base stations. Remote units 1120, 1130, and 1150 include IC devices 1125A, 1125C, and 1125B that include the disclosed harmonic-rejection mixer (HRM). It will be recognized that other devices may also include the disclosed harmonic reject mixer, such as the base stations, user equipment, and network equipment. FIG. 11 shows forward link signals 1180 from the base station 1140 to the remote units 1120, 1130, and 1150 and reverse link signals 1190 from the remote units 1120, 1130, and 1150 to base station 1140.

In FIG. 11, remote unit 1120 is shown as a mobile telephone, remote unit 1130 is shown as a portable computer, and remote unit 1150 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 11 illustrates remote units according to the aspects of the present disclosure, the present disclosure is not limited to these exemplary illustrated units. Aspects of the present disclosure may be suitably employed in many devices, which include the disclosed harmonic reject mixer.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. In addition, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects, which do not provide all of the features and advantages set forth herein, are also within the scope of this present disclosure. For example, the apparatuses, methods, and systems described herein may be performed digitally and differentially, among others. Accordingly, the scope of the present disclosure is intended to be defined only by reference to the appended claims.

What is claimed is:

1. A communication circuit comprising:
a first pair of digital-to-analog converters (DACs) coupled to an input of a first mixer and configured to generate a first plurality of baseband signals;
a second pair of DACs coupled to an input of a second mixer and configured to generate a second plurality of baseband signals, the second plurality of baseband signals shifted in phase relative to the first plurality of baseband signals;
a first pair of baseband filters (BBFs) coupled to the first pair of DACs; and
a second pair of baseband filters coupled to the second pair of DACs, wherein each baseband filter comprises a common mode feedback loop.

2. The communication circuit of claim 1, in which the first plurality of baseband signals are shifted in phase by 45 degrees relative to the second plurality of baseband signals.

3. The communication circuit of claim 1, in which the first plurality of baseband signals and the second plurality of baseband signals comprise analog signals.

4. The communication circuit of claim 1, in which the first plurality of baseband signals and the second plurality of baseband signals comprise differential signals.

5. The communication circuit of claim 1, in which each baseband filter comprises a resistor-capacitor (RC) filter.

6. The communication circuit of claim 1, further comprising:
a first phase generator coupled to an input of a first one of the second pair of DACs and configured to receive baseband data comprising an in-phase (I) component and a quadrature-phase (Q) component and configured to generate a first new component of baseband data from both of the received I and Q components; and
a second phase generator coupled to an input of second one of the second pair of DACs and configured to receive the baseband data comprising the I component and the Q component and configured to generate a second new component of baseband data from both of the received I and Q components, the first new component differing from the second new component.

7. The communication circuit of claim 6, in which the baseband data, the first new component of baseband data, and the second new component of baseband data comprise digital data.

8. The communication circuit of claim 6, in which the first new component of baseband data is shifted by 45 degrees relative to the I component, and the second new component of baseband data is shifted in phase by 45 degrees relative to the Q component.

9. The communication circuit of claim 1, in which:
the first mixer comprises a first pair of mixers configured to receive the first plurality of baseband signals and a first plurality of local oscillator (LO) signals; and
the second mixer comprises a second pair of mixers configured to receive the second plurality of baseband signals and a second plurality of LO signals, the second plurality of baseband signals shifted in phase relative to the first plurality of baseband signals, and the second plurality of LO signals shifted in phase relative to the first plurality of LO signals, the first pair of mixers and the second pair of mixers configured to generate voltage mode outputs.

10. The communication circuit of claim 9, in which outputs of the mixers are coupled to each other through a short duty cycle local oscillator (LO) pulse.

11. The communication circuit of claim 1, in which in-phase (I) signals and quadrature-phase (Q) signals input to the first pair of DACs are each clocked by a rising edge of a sampling clock signal.

12. The communication circuit of claim 11, in which in-phase (I) signals and quadrature-phase (Q) signals input to the second pair of DACs are each clocked by a falling edge of the sampling clock signal.

13. A method for communication, comprising:
generating a first plurality of baseband signals with a first pair of digital-to-analog converters (DACs); and
generating a second plurality of baseband signals with a second pair of DACs, the second plurality of baseband signals shifted in phase relative to the first plurality of baseband signals
wherein in-phase (I) signals and quadrature-phase (Q) signals input to the first pair of DACs are each clocked by a rising edge of a sampling clock signal.

14. The method of claim 13, in which the first plurality of baseband signals are shifted in phase by 45 degrees relative to the second plurality of baseband signals.

15. The method of claim 13, in which the first plurality of baseband signals and the second plurality of baseband signals comprise analog signals.

16. The method of claim 13, in which the first plurality of baseband signals and the second plurality of baseband signals comprise differential signals.

17. The method of claim 13, further comprising:
receiving baseband data comprising an in-phase (I) component and a quadrature-phase (Q) component;
generating a first new component of baseband data from both of the received I and Q components; and
generating a second new component of baseband data from both of the received I and Q components.

18. The method of claim 17, in which the received baseband data, the first new component of baseband data, and the second new component of baseband data comprise digital data.

19. The method of claim 17, in which the first new component of baseband data is shifted by 45 degrees relative to the I component, and the second new component of baseband data is shifted in phase by 45 degrees relative to the Q component.

20. The method of claim 13, in which in-phase (I) signals and quadrature-phase (Q) signals input to the second pair of DACs are each clocked by a falling edge of the sampling clock signal.

21. A communication circuit comprising:
first means for generating a first plurality of baseband signals; and
second means for generating a second plurality of baseband signals, the second plurality of baseband signals shifted in phase relative to the first plurality of baseband signals, wherein:
in-phase (I) signals and quadrature-phase (Q) signals input to the first means are each clocked by a rising edge of a sampling clock signal; and
in-phase (I) signals and quadrature-phase (Q) signals input to the second means are each clocked by a falling edge of the sampling clock signal.

* * * * *